(12) United States Patent
Yamada

(10) Patent No.: US 7,474,570 B2
(45) Date of Patent: Jan. 6, 2009

(54) SEMICONDUCTOR DEVICE

(75) Inventor: Kouichi Yamada, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 476 days.

(21) Appl. No.: 11/247,153

(22) Filed: Oct. 12, 2005

(65) Prior Publication Data

US 2006/0133133 A1    Jun. 22, 2006

(30) Foreign Application Priority Data

Dec. 21, 2004    (JP)    ............... 2004-369006

(51) Int. Cl.
*G11C 7/00*    (2006.01)
(52) U.S. Cl. .................. 365/189.11; 365/185.24; 365/185.26
(58) Field of Classification Search ............ 365/185.26, 365/185.24, 189.11
See application file for complete search history.

(56) References Cited

U.S. PATENT DOCUMENTS 4,277,702 A * 7/1981 Hamilton et al. ............... 377/58

FOREIGN PATENT DOCUMENTS

| JP | 8-339681 | 12/1996 |
|---|---|---|
| JP | 2002-050576 A | 2/2002 |

* cited by examiner

*Primary Examiner*—Pho M. Luu
(74) *Attorney, Agent, or Firm*—McDermott Will & Emery LLP

(57) ABSTRACT

A semiconductor device capable of improving the accuracy determines whether a prescribed input potential is higher or lower than a reference potential. This semiconductor device comprises first capacitance unit and second capacitance unit having different ON- and OFF-state capacitances. The semiconductor device changes the potential of a first electrode of the first capacitance unit and the potential of a first electrode of the second capacitance unit from a first potential to a second potential thereby enlarging the difference between a potential input in a second electrode of the first capacitance unit and a potential input in a second electrode of the second capacitance unit and comparing the potential input in the second electrode of the first capacitance unit and the potential input in the second electrode of the second capacitance unit with each other.

20 Claims, 16 Drawing Sheets

SEMICONDUCTOR DEVICE

BACKGROUND OF THE INVENTION

1. Field of the Invention

The present invention relates to a semiconductor device.

2. Description of the Background Art

In general, a DRAM (dynamic random access memory) is known as an exemplary semiconductor device, as disclosed in Japanese Patent Laying-Open No. 8-339681 (1996), for example.

The DRAM disclosed in the aforementioned Japanese Patent Laying-Open No. 8-339681 equalizes the difference between a potential corresponding to data "1" read from a capacitor of a memory cell on a bit line and a reference potential with the difference between a potential corresponding to data "0" and the reference potential by increasing both of the potentials corresponding to the data "1" and "0" respectively in data reading, in order to compensate reduction of the difference between the potential corresponding to the data "1" and the reference potential beyond the difference between the potential corresponding to the data "0" and the reference potential. Thus, the DRAM disclosed in the aforementioned Japanese Patent Laying-Open No. 8-339681 equalizes the difference between an input potential corresponding to the data "1" introduced into a sense amplifier through the bit line and the reference potential with the difference between an input potential corresponding to the data "0" introduced into the sense amplifier through another bit line and the reference potential when determining the data read from the memory cell onto the bit line through the sense amplifier.

In the DRAM disclosed in the aforementioned Japanese Patent Laying-Open No. 8-339681, however, the difference between the potentials of the bit lines corresponding to the data "1" and "0" respectively after the potential increase remains identical to that before the potential increase. In other words, the difference between the potentials of the bit lines corresponding to the data "1" and "0" respectively is not increased after the potential increase. Therefore, it may disadvantageously be difficult to determine whether the input potential is higher or lower than the reference potential if the difference between the potentials (input potentials) of the bit lines corresponding to the data "0" and "1" respectively and the reference potential is reduced due to reduction of the quantity of charges corresponding to the data held in the capacitors of the memory cells following refinement of the capacitors. Thus, the accuracy for determining whether the input potentials are higher or lower than the reference potential is disadvantageously reduced.

SUMMARY OF THE INVENTION

The present invention has been proposed in order to solve the aforementioned problem, and an object of the present invention is to provide a semiconductor device capable of improving the accuracy for determining whether a prescribed input potential is higher or lower than a reference potential.

In order to attain the aforementioned object, a semiconductor device according to an aspect of the present invention comprises first capacitance means and second capacitance means having different ON- and OFF-state capacitances. The semiconductor device changes the potential of a first electrode of the first capacitance means and the potential of a first electrode of the second capacitance means from a first potential to a second potential thereby enlarging the difference between a potential input in a second electrode of the first capacitance means and a potential input in a second electrode of the second capacitance means and comparing the potential input in the second electrode of the first capacitance means and the potential input in the second electrode of the second capacitance means with each other.

As hereinabove described, the semiconductor device according to this aspect can compare a prescribed input potential with a reference potential by enlarging the difference therebetween when inputting the prescribed input potential in the second electrode of the first capacitance means while inputting the reference potential in the second electrode of the second capacitance means by changing the potentials of the first electrodes of the first and second capacitance means from the first potential to the second potential thereby enlarging the difference between the potentials input in the second electrodes of the first and second capacitance means respectively and comparing these potentials with each other. Thus, the semiconductor device can more reliably determine whether the prescribed input potential is higher or lower than the reference potential as compared with a case of comparing the prescribed input potential and the reference potential with each other without enlarging the potential difference. Therefore, the semiconductor device can improve the accuracy for determining whether the prescribed input potential is higher or lower than the reference potential.

In the semiconductor device according to the aforementioned aspect, the first capacitance means and the second capacitance means having the different ON- and OFF-state capacitances preferably include either transistor elements serving as capacitors or capacitive elements, switchable between ON- and OFF-states, other than the transistor elements. According to this structure, the first and second capacitance means having different ON- and OFF-state capacitances can be easily obtained.

The semiconductor device according to the aforementioned aspect preferably further comprises a determination circuit determining whether the potential of the second electrode of either the first capacitance means or the second capacitance means is higher or lower than the potential of the second electrode of either the second capacitance means or the first capacitance means by comparing the potential of the second electrode of the first capacitance means and the potential of the second electrode of the second capacitance means after the enlargement of the potential difference with each other. According to this structure, the determination circuit can easily determine whether the prescribed input potential is higher or lower than the reference potential when inputting the prescribed input potential in the second electrode of the first capacitance means while inputting the reference potential in the second electrode of the second capacitance means.

In this case, the determination circuit may include a sense amplifier determining whether the potential of the second electrode of either the first capacitance means or the second capacitance means is higher or lower than the potential of the second electrode of either the second capacitance means or the first capacitance means by further amplifying the difference between the potential of the second electrode of the first capacitance means and the potential of the second electrode of the second capacitance means after the enlargement of the potential difference and thereafter comparing the potential of the second electrode of the first capacitance means and the potential of the second electrode of the second capacitance means with each other. According to this structure, the sense amplifier, receiving the potentials of the second electrodes of the first and second capacitance means after the enlargement of the potential difference, can easily determine whether the prescribed input potential is higher or lower than the reference potential also when the difference between the potentials input in the second electrodes of the first and second capacitance means respectively is smaller than the sensitivity of the sense amplifier.

In the semiconductor device according to the aforementioned aspect, the first capacitance means and the second capacitance means preferably have substantially identical threshold voltages bringing ON-states when the first electrode of the first capacitance means and the first electrode of the second capacitance means are at the first potential while bringing OFF-states when the first electrode of the first capacitance means and the first electrode of the second capacitance means are at the second potential, and the potential of the first electrode of the first capacitance means and the potential of the first electrode of the second capacitance means are preferably changed from the first potential to the second potential at a first rate of change thereby the potential of the second electrode of the first capacitance means and the potential of the second electrode of the second capacitance means are changed at a second rate of change smaller than the first rate of change. The first rate of change may be either linear or nonlinear. According to this structure, the absolute value of the difference between the potentials of the second and first electrodes of the first capacitance means is first reduced below the absolute values of the substantially identical threshold voltages of the first and second capacitance means and the absolute value of the difference between the second and first electrodes of the second capacitance means is thereafter reduced below the absolute values of the substantially identical threshold voltages of the second and first capacitance means with a delay of a prescribed period when the semiconductor device changes the potential of the first electrode of the first capacitance means and the potential of the first electrode of the second capacitance means from the first potential to the second potential at the first rate of change while changing the potential of the second electrode of the first capacitance means and the potential of the second electrode of the second capacitance means at the second rate of change smaller than the first rate of change if the difference between a potential input in the second electrode of the first capacitance means and the potential of the first electrode thereof is smaller than the difference between a potential input in the second electrode of the second capacitance means and the potential of the first electrode thereof in an initial state. In this case, the semiconductor memory brings the first capacitance means from an ON-state into an OFF-state in advance thereby reducing the second rate of change for the potential of the second electrode of the first capacitance means, and thereafter brings the second capacitance means from an ON-state into an OFF-state with a delay of a prescribed period thereby reducing the second rate of change for the potential of the second electrode of the second capacitance means. Thus, the second rate of change for the potential of the second electrode of the second capacitance means exceeds that of the potential of the second electrode of the first capacitance means for the prescribed period after the reduction of the second rate of change for the potential of the second electrode of the first capacitance means, whereby the semiconductor device can enlarge the difference between the potentials of the second electrodes of the first and second capacitance means in this prescribed period.

In this case, the semiconductor device preferably reduces the second rate of change for the potential of the second electrode of the first capacitance means by changing the potential of the first electrode of the first capacitance means and the potential of the first electrode of the second capacitance means at the first rate of change while reducing the absolute value of the difference between the potential of the second electrode of the first capacitance means and the potential of the first electrode of the first capacitance means below the absolute value of the threshold voltage of the first capacitance means thereby bringing the first capacitance means from an ON-state into an OFF-state, and thereafter reduces the second rate of change for the potential of the second electrode of the second capacitance means by reducing the absolute value of the difference between the potential of the second electrode of the second capacitance means and the potential of the first electrode of the second capacitance means below the absolute value of the threshold voltage of the second capacitance means thereby bringing the second capacitance means from an ON-state into an OFF-state with a delay of a prescribed period. According to this structure, the semiconductor device can easily reduce the second rate of change for the potential of the second electrode of the first capacitance means in advance and thereafter change the second rate of change for the potential of the second electrode of the second capacitance means with the delay of the prescribed period when changing the potentials of the second electrodes of the first and second capacitance means at the second rate of change smaller than the firs rate of change following the change of the potentials of the first electrodes of the first and second capacitance means at the first rate of change.

The semiconductor device according to the aforementioned aspect preferably reduces the second rate of change for the potential of the second electrode of either the first capacitance means or the second capacitance means by changing the potential of the first electrode of the first capacitance means and the potential of the first electrode of the second capacitance means from the first potential to the second potential at the first rate of change while reducing the absolute value of the difference between the potentials of the first and second electrodes of either the first capacitance means or the second capacitance means below the absolute value of the threshold voltage of the corresponding first or second capacitance means thereby bringing either the first capacitance means or the second capacitance means into an OFF-state. According to this structure, the semiconductor device, capable of reducing the second rate of change for the potential of the second electrode of either the first or second capacitance means when changing the potentials of the first electrodes of the first and second capacitance means from the first potential to the second potential, can easily enlarge the difference between the potentials of the second electrodes of the first and second capacitance means.

The semiconductor device according to the aforementioned aspect preferably further comprises a boot circuit outputting a potential changing from the first potential to the second potential at a first rate of change to the first electrode of the first capacitance means and the first electrode of the second capacitance means. According to this structure, the semiconductor device can easily change the potentials of the first electrodes of the first and second capacitance means from the first potential to the second potential at the first rate of change with the potential output from the boot circuit.

In this case, the boot circuit preferably includes a first transistor having a threshold voltage substantially identical to that of either the first capacitance means or the second capacitance means, voltage change means reducing or increasing the potential of the source region or the drain region of the first transistor by a prescribed voltage and a second transistor for changing the potential of the source region or the drain region of the first transistor to the second potential at the first rate of change, for inputting a potential substantially identical to the potential input in the second electrode of either the first capacitance means or the second capacitance means in the gate electrode of the first transistor when the potential of the first electrode of either the first capacitance means or the second capacitance means is at the first potential. According to this structure, the semiconductor device can set the source region or the drain region of the first transistor to a potential different from the potential input in the second electrode of the first capacitance means by the threshold voltage of the first capacitance means while changing the potential of the source region or the drain region of the first transistor further by a prescribed voltage through the voltage change means and outputting the same by inputting the potential substantially identical to the potential input in the second electrode of the first capacitance means in the gate electrode of the first transistor having the threshold voltage substantially identical to that of the first capacitance means. Thus, the boot circuit can output a potential different from the potential input in the second electrode of the first capacitance means by a level larger than the threshold voltage of the first capacitance means as the first potential. Further, the boot circuit can output the first potential while changing the same to the second potential at the first rate of change through the second transistor. Thus, the boot circuit can output the first potential different from the potential input in the second electrode of the first capacitance means by the threshold voltage of the first capacitance means while changing the same to the second potential at the first rate of change.

In the aforementioned semiconductor device comprising the voltage change means, the voltage change means may include either a high resistance or a transistor. According to this structure, the semiconductor device can easily reduce or increase the potential of the source region or the drain region of the first transistor by the prescribed voltage.

The semiconductor device according to the aforementioned aspect preferably comprises a plurality of potential difference enlarging circuits including the first capacitance means and the second capacitance means, for enlarging the difference between the potential input in the second electrode of the first capacitance means and the potential input in the second electrode of the second capacitance means a plurality of times through the plurality of potential difference enlarging circuits. According to this structure, the semiconductor device can further enlarge the difference between the potentials input in the second electrodes of the first and second capacitance means respectively. Thus, the semiconductor device can further improve the accuracy for determining whether the prescribed input potential is higher or lower than the reference potential when inputting the prescribed input potential in the second electrode of the first capacitance means while inputting the reference potential in the second electrode of the second capacitance means.

In this case, the plurality of potential difference enlarging circuits preferably include a first potential difference enlarging circuit including first conductivity type first capacitance means and first conductivity type second capacitance means and a second potential difference enlarging circuit including second conductivity type first capacitance means and second conductivity type second capacitance means, while the semiconductor device preferably inputs the first potential in the second electrode of the first conductivity type first capacitance means and the second electrode of the second conductivity type first capacitance means while inputting the second potential in the second electrode of the first conductivity type second capacitance means and the second electrode of the second conductivity type second capacitance means, enlarges the difference between the first potential input in the second electrode of the first conductivity type first capacitance means and the second potential input in the second electrode of the first conductivity type second capacitance means through the first potential difference enlarging circuit and thereafter enlarges the difference between the first potential in the second electrode of the second conductivity type first capacitance means and the second potential in the second electrode of the second conductivity type second capacitance means. According to this structure, the semiconductor device can further enlarge the difference between the potential of the second electrode of the second conductivity type first capacitance means, identical to the potential of the second electrode of the first conductivity type first capacitance means, and the potential of the second electrode of the second conductivity type second capacitance means, identical to the potential of the second electrode of the first conductivity type second capacitance means, through the second difference potential enlarging circuit after enlarging the difference between the potentials input in the second electrodes of the first conductivity type first and second capacitance means through the first potential difference enlarging circuit. Thus, the semiconductor device can easily further enlarge the difference between the prescribed input potential and the reference potential when inputting the prescribed input potential in the second electrodes of the first conductivity type first capacitance means and the second conductivity type first capacitance means while inputting the reference potential in the second electrodes of the first conductivity type second capacitance means and the second conductivity type second capacitance means.

In the semiconductor device according to the aforementioned aspect, the first capacitance means preferably includes a third transistor serving as a capacitor having different ON- and OFF-state capacitances, the first electrode of the first capacitance means preferably includes at least either the source region or the drain region of the third transistor, the second electrode of the first capacitance means preferably includes the gate electrode of the third transistor, the second capacitance means preferably includes a fourth transistor serving as a capacitor having different ON- and OFF-state capacitances, the first electrode of the second capacitance means preferably includes at least either the source region or the drain region of the fourth transistor, and the second electrode of the second capacitance means preferably includes the gate electrode of the fourth transistor. According to this structure, the semiconductor device can easily enlarge the difference between the prescribed input potential input in the gate electrode of the third transistor and the reference potential input in the gate electrode of the fourth transistor by changing the potentials of at least either the source regions or the drain regions of the third and fourth transistors from the first potential to the second potential when inputting the prescribed input potential in the gate electrode of the third transistor while inputting the reference potential in the gate electrode of the fourth transistor.

In the semiconductor device according to the aforementioned aspect, the first capacitance means preferably includes a third transistor serving as a capacitor having different ON- and OFF-state capacitances, the first electrode of the first capacitance means preferably includes the gate electrode of the third transistor, the second electrode of the first capacitance means preferably includes at least either the source region or the drain region of the third transistor, the second capacitance means preferably includes a fourth transistor serving as a capacitor having different ON- and OFF-state capacitances, the first electrode of the second capacitance means preferably includes the gate electrode of the fourth transistor, and the second electrode of the second capacitance means preferably includes at least either the source region or the drain region of the fourth transistor. According to this structure, the semiconductor device can easily enlarge the difference between the prescribed input potential input in at least either the source region or the drain region of the third transistor and the reference potential input in at least either the source region or the drain region of the fourth transistor by changing the potentials of the gate electrodes of the third and fourth transistors from the first potential to the second potential when inputting the prescribed input potential in at least either the source region or the drain region of the third transistor while inputting the reference potential in at least either the source region or the drain region of the fourth transistor.

In the semiconductor device according to the aforementioned aspect, the first capacitance means may include a third transistor serving as a capacitor having different ON- and OFF-state capacitances, the second capacitance means may include a fourth transistor serving as a capacitor having different ON- and OFF-state capacitances, and the ON-state capacitances of the third transistor and the fourth transistor may be larger than the OFF-state capacitances. According to this structure, the semiconductor device capable of reducing the capacitances when changing the third and fourth transistors from ON-states to OFF-states can reduce the rates of change for the potentials.

In this case, the third transistor and the fourth transistor preferably have gate widths smaller than gate lengths. According to this structure, the semiconductor device capable of further reducing OFF-state capacitances can further reduce the rates of change for the potentials. Thus, the semiconductor device can further enlarge the difference between the prescribed input potential input in the third transistor and the reference potential input in the fourth transistor.

The semiconductor device according to the aforementioned aspect preferably further comprises storage means holding data and a data line linked with the storage means and connected to the second electrode of either the first capacitance means or the second capacitance means, for inputting a potential responsive to the data held in the storage means in the second electrode of either the first capacitance means or the second capacitance means through the data line while inputting a reference potential in the second electrode of either the second capacitance means or the first capacitance means when reading the data. According to this structure, the semiconductor device can enlarge and compare the difference between the potential responsive to the data, held in the storage means, input in the second electrode of the first capacitance means and the reference potential input in the second electrode of the second capacitance means by changing the potentials of the first electrodes of the first and second capacitance means from the first potential to the second potential in data reading. Thus, the semiconductor device can improve the accuracy for determining whether the potential responsive to the data held in the storage means is higher or lower than the reference potential.

In the semiconductor device according to the aforementioned aspect, the storage means may include either a ferroelectric capacitor or a capacitor.

The semiconductor device comprising the aforementioned storage means preferably further comprises a driving line linked with the storage means, for applying a voltage pulse to the storage means through the driving line when reading the data thereby inputting a negative potential in the second electrode of either the first capacitance means or the second capacitance means from the storage means through the data line if the storage means holds first data while inputting a positive potential in the second electrode of either the first capacitance means or the second capacitance means from the storage means through the data line if the storage means holds second data. According to this structure, the semiconductor device, inputting the negative potential in the second electrode of the first capacitance means if the storage means holds the first data while inputting the positive potential in the second electrode of the first capacitance means if the storage means holds the second data, can set the reference potential to the ground potential positioned between the positive and negative potentials in the initial state before enlarging the potential responsive to the data, held in the storage means, input in the second electrode of the first capacitance means and the reference potential input in the second electrode of the second capacitance means when determining whether the potential responsive to the data held in the storage means is higher or lower than the reference potential by comparing the potential responsive to the data, held in the storage means, input in the second electrode of the first capacitance means and the reference potential input in the second electrode of the second capacitance means with each other. Thus, the semiconductor device can easily set the reference potential also when the potential generated on the data line is dispersed in data reading. Further, the semiconductor device capable of setting the reference potential to the ground potential can employ the ground potential generally employed therein as the reference potential. Thus, no circuit may be separately provided for generating the reference potential dissimilarly to a case of setting the reference potential to a level other than the ground level, whereby the circuit structure of the semiconductor device can be simplified. In this case, the storage means may include a ferroelectric capacitor having a ferroelectric film provided between a word line and a bit line arranged to intersect with each other.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

The structure of a potential comparison circuit 1 according to a first embodiment of the present invention is described with reference to FIGS. 1 and 2.

Figure 1:
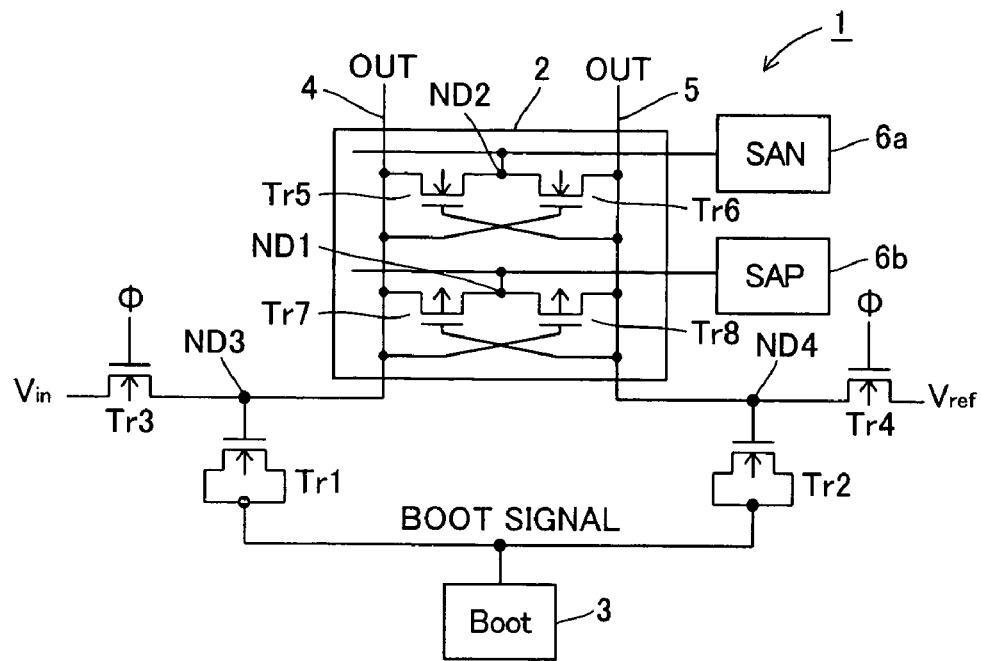
FIG. 1 is a circuit diagram showing the structure of a potential comparison circuit according to a first embodiment of the present invention.

The potential comparison circuit 1 according to the first embodiment is constituted of four n-channel transistors Tr1 to Tr4, a sense amplifier 2 and a boot signal generation circuit 3 as well as a SAN circuit 6a and a SAP circuit 6b driving the sense amplifier 2, as shown in FIG. 1. The n-channel transistor Tr1 is an example of the "first capacitance means" or the "third transistor" in the present invention, and the n-channel transistor Tr2 is an example of the "second capacitance means" or the "fourth transistor" in the present invention. Each of the n-channel transistors Tr1 and Tr2 has a pair of source/drain regions (source or drain regions) connected with each other, to serve as a capacitor. The n-channel transistors Tr1 and Tr2 have the same threshold voltage $V_t$ (about 0.7 V). The boot signal generation circuit 3 is connected to the pairs of source/drain regions of the n-channel transistors Tr1 and Tr2 respectively.

The gate of the n-channel transistor Tr1 is connected to either the source region or the drain region of the n-channel transistor Tr3 and the sense amplifier 2. A prescribed input potential $V_{in}$ is input in either the drain region or the source region of the n-channel transistor Tr3, while a clock signal Φ is input in the gate thereof. The gate of the n-channel transistor Tr2 is connected to either the source region or the drain region of the n-channel transistor Tr4 and the sense amplifier 2. A reference potential $V_{ref}$ is input in either the drain region or the source region of the n-channel transistor Tr4, while the clock signal Φ is input in the gate thereof similarly to the gate of the aforementioned n-channel transistor Tr3.

The sense amplifier 2 has a function of amplifying enlarged difference between the input potential $V_{in}$ and the reference potential $V_{ref}$ while determining whether the input potential $V_{in}$ is higher or lower than the reference potential $V_{ref}$ by comparing the input potential ($V_{inα}$) and the reference potential ($V_{refα}$) after the enlargement of the potential difference. This sense amplifier 2 includes two n-channel transistors Tr5 and Tr6 and two p-channel transistors Tr7 and Tr8. Inputs/outputs of a CMOS inverter formed by the n-channel transistor Tr5 and the p-channel transistor Tr7 of the sense amplifier 2 and that formed by the n-channel transistor Tr6 and the p-channel transistor Tr8 of the sense amplifier 2 are cross-coupled with each other. A sense amplifier activation signal SAP is input in a node ND1 between either the source region or the drain region of the p-channel transistor Tr7 and either the source region or the drain region of the p-channel transistor Tr8. Another sense amplifier activation signal SAN is input in a node ND2 between either the source region or the drain region of the n-channel transistor Tr5 and either the source region or the drain region of the n-channel transistor Tr6.

The potential of a node ND3 input in the gate of the n-channel transistor Tr1 is input in either the drain region or the source region of the p-channel transistor Tr7, the gate of the p-channel transistor Tr8, either the drain region or the source region of the n-channel transistor Tr5 and the gate of the n-channel transistor Tr6. The potential of a node ND4 input in the gate of the n-channel transistor Tr2 is input in either the drain region or the source region of the p-channel transistor Tr8, the gate of the p-channel transistor Tr7, either the drain region or the source region of the n-channel transistor Tr6 and the gate of the n-channel transistor Tr5. Output lines 4 and 5 are provided for outputting the input potential ($V_{inβ}$) and the reference potential ($V_{refβ}$) subjected to enlargement of the difference therebetween by the sense amplifier 2 respectively. The output line 4 is connected to either the drain region or the source region of the p-channel transistor Tr7, the gate of the p-channel transistor Tr8, either the drain region or the source region of the n-channel transistor Tr5 and the gate of the n-channel transistor Tr6. The output line 5 is connected to either the drain region or the source region of the p-channel transistor Tr8, the gate of the p-channel transistor Tr7, either the drain region or the source region of the n-channel transistor Tr6 and the gate of the n-channel transistor Tr5.

Figure 2:
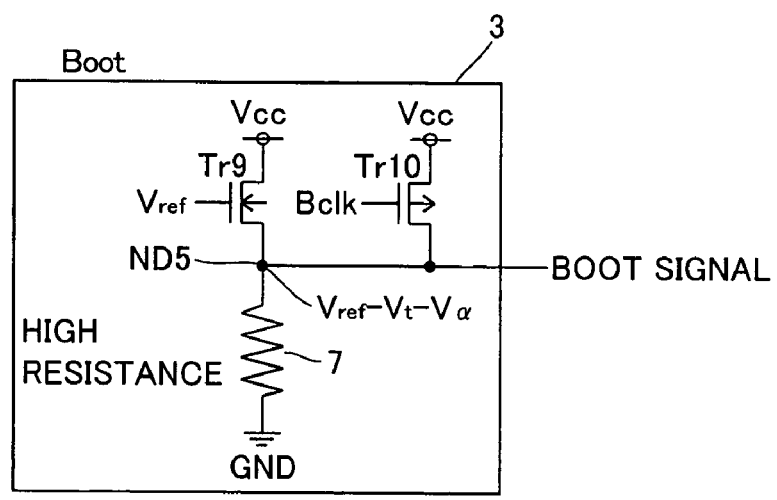
FIG. 2 is a circuit diagram showing the structure of a boot signal generation circuit of the potential comparison circuit according to the first embodiment shown in FIG. 1.

As shown in FIG. 2, the boot signal generation circuit 3 includes an n-channel transistor Tr9, a p-channel transistor Tr10 and a high resistance 7. The n-channel transistor Tr9 is an example of the "first transistor" in the present invention, and the p-channel transistor Tr10 is an example of the "second transistor" in the present invention. The high resistance 7 is an example of the "voltage change means" in the present invention. The n-channel transistor Tr9 has the same threshold voltage $V_t$ (about 0.7 V) as the aforementioned n-channel transistors Tr1 and Tr2. The reference potential $V_{ref}$ is input in the gate of the n-channel transistor Tr9, similarly to the gate of the n-channel transistor Tr2. A potential Vcc is input in either the source region or the drain region of the n-channel transistor Tr9, while a first end of the high resistance 7 is connected to either the drain region or the source region. A second end of the high resistance 7 is supplied with the ground potential (GND). A boot clock signal Bclk is input in the gate of the p-channel transistor Tr10. Either the source region or the drain region of the p-channel transistor Tr10 receives the potential Vcc, while either the drain region or the source region is connected to a node ND5 between the n-channel transistor Tr9 and the high resistance 7. The node ND5 outputs a boot signal, which in turn is input in the pairs of source/drain regions of the n-channel transistors Tr1 and Tr2 (see FIG. 1) respectively.

Operations of the potential comparison circuit 1 according to the first embodiment of the present invention are now described with reference to FIGS. 1 to 3.

In an initial state, a high-level clock signal Φ is input in the gates of the n-channel transistors Tr3 and Tr4 (see FIG. 1), for turning on the n-channel transistors Tr3 and Tr4 respectively. Thus, the nodes ND3 and ND4 are at the input potential $V_{in}$ and the reference potential $V_{ref}$ respectively. It is assumed that a potential of about 1.5 is input as the input potential $V_{in}$ and a potential of about 1.51 V higher than the reference potential $V_{ref}$ (about 1.5 V) by about 0.01 V is input as the reference potential $V_{ref}$ in this initial state. In this state, the difference $V_A$ between the input potential $V_{in}$ and the reference potential $V_{ref}$ is about 0.01 V. The reference potential $V_{ref}$ (about 1.5 V) is input in the gate of the n-channel transistor Tr9 of the boot signal generation circuit 3 (see FIG. 2). Thus, the n-channel transistor Tr9 is in an ON-state. The potential of the node ND5 is reduced from the reference potential $V_{ref}$ (about 1.5 V) by the threshold voltage $V_t$ (about 0.7 V) of the n-channel transistor Tr9, and further reduced by a prescribed voltage $V_\alpha$ (about 0.3 V) through the high resistance 7. In other words, the node ND5 between the n-channel transistor Tr9 and the high resistance 7 is at a potential ($V_{ref}-V_t-V_\alpha$) (about 0.5 V). In the initial state, a high-level boot clock signal Bclk is input in the gate of the p-channel transistor Tr10. Thus, the p-channel transistor Tr10 is in an OFF-state. Therefore, the boot signal generation circuit 3 outputs a boot signal of the potential ($V_{ref}-V_t-V_\alpha$) (about 0.5 V) in the initial state. This boot signal is input in the pairs of source/drain regions of the n-channel transistors Tr1 and Tr2 (see FIG. 1).

The potential ($V_{in}$: about 1.51 V) of the node ND3 is input in the gate of the n-channel transistor Tr1, while the potential ($V_{ref}$: about 1.5 V) is input in the gate of the n-channel transistor Tr2. In other words, the difference ($V_{gs}$=about 1.01 V) between the gate potential ($V_{in}$: about 1.51 V) of the n-channel transistor Tr1 and the potential ($V_{ref}-V_t-V_\alpha$: about 0.5 V) of the source/drain regions is larger than the threshold voltage $V_t$ (about 0.7 V) of the n-channel transistor Tr1, whereby the n-channel transistor Tr1 is in an ON-state. Further, the difference ($V_{gs}$=about 1.01 V) between the gate potential ($V_{ref}$: about 1.5 V) of the n-channel transistor Tr2 and the potential ($V_{ref}-V_t-V_\alpha$: about 0.5 V) of the source/drain regions is larger than the threshold voltage $V_t$ (about 0.7 V) of the n-channel transistor Tr2, whereby the n-channel transistor Tr2 is also in an ON-state. When the n-channel transistors Tr1 and Tr2 are in ON-states, the gate capacitances of the n-channel transistors Tr1 and Tr2 serving as capacitors reach levels present between the gates thereof and the source/drain regions as well as the channel regions. Thereafter a low-level clock signal Φ is input in the gates of the n-channel transistors Tr3 and Tr4 respectively. Thus, the n-channel transistors Tr3 and Tr4 enter OFF-states. Therefore, the node ND3 enters a floating state while holding the input potential ($V_{in}$: about 1.51 V), and the node ND4 also enters a floating state while holding the reference potential ($V_{ref}$: about 1.5 V).

In a boot period (see FIG. 3), the potential comparison circuit 1 reduces the boot clock signal Bclk input in the gate of the p-channel transistor Tr10 of the boot signal generation circuit 3 (see FIG. 2) to a low level. Thus, a current flows through the p-channel transistor Tr10, whereby the potential of the boot signal output from the boot signal generation circuit 3 is gradually increased from the level ($V_{ref}-V_t-V_\alpha$: about 0.5 V). Therefore, the potentials of the source/drain regions of the n-channel transistors Tr1 and Tr2 (see FIG. 1) are also gradually increased from the level ($V_{ref}-V_t-V_\alpha$: about 0.5 V). At this time, the potential comparison circuit 1 boots the potential of the node ND3 input in the gate of the n-channel transistor Tr1 to increase the same through the gate capacitance of the n-channel transistor Tr1 serving as a capacitor while booting the potential of the node ND4 input in the gate of the n-channel transistor Tr2 to increase the same through the gate capacitance of the n-channel transistor Tr2 serving as a capacitor. Thus, the potential comparison circuit 1 increases the potentials of the nodes ND3 and ND4.

Figure 3:
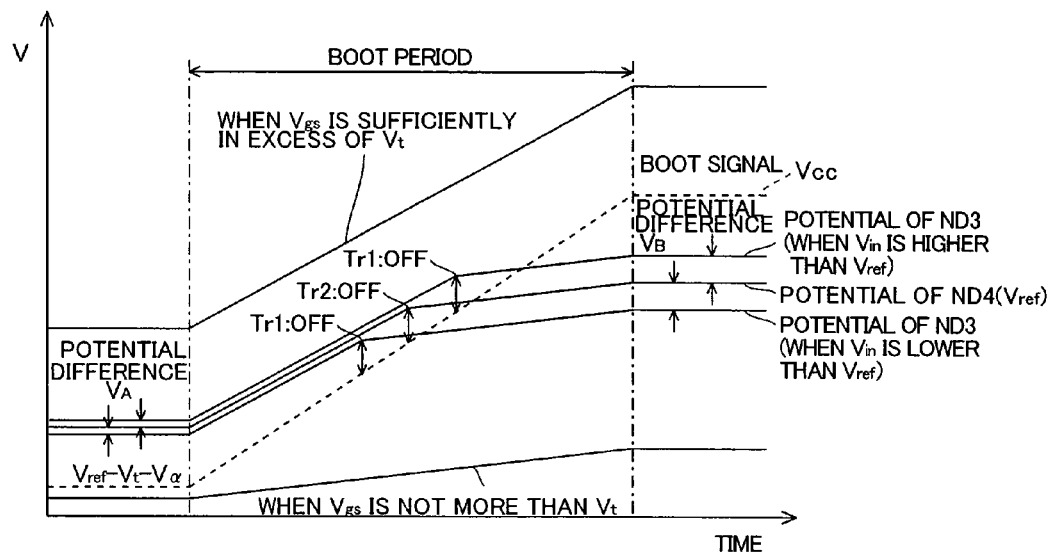
FIG. 3 is a voltage waveform diagram for illustrating operations of the potential comparison circuit according to the first embodiment.

At this time, the rate of change (inclination) of the potential increase in the boot signal is larger than the rates of change (inclination) of the increased potentials of the nodes ND3 and ND4, as shown in FIG. 3. This is because the potential comparison circuit 1 distributes charges from the gate capacitances of the n-channel transistors Tr1 and Tr2 to the input capacitance of the sense amplifier 2 and a parasitic capacitance of a wire or the like present in addition to the gate capacitances of the n-channel transistors Tr1 to Tr2 when increasing the potential of the boot signal input in the source/drain regions of the n-channel transistors Tr1 and Tr2 thereby reducing the rates of change of the potential increase in the nodes ND3 and ND4 beyond that of the potential increase in the boot signal. As the potentials of the boot signal and the nodes ND3 and ND4 are increased, the difference therebetween is reduced due to the rate of change of the potential increase in the boot signal larger than those of the potential increase in the nodes ND3 and ND4. The difference between the potentials of the node ND4 and the boot signal is reduced below the threshold voltage $V_t$ (about 0.7 V) of the n-channel transistor Tr2 at prescribed timing, thereby turning off the n-channel transistor Tr2. Thus, the capacitance between the gate and the source/drain regions of the n-channel transistor Tr2 serving as a capacitor is abruptly reduced. In other words, the capacitance of a channel region located under the gate of the n-channel transistor Tr2 is reduced and hence the capacitance between the gate and the source/drain regions of the n-channel transistor Tr2 serving as a capacitor is substantially only that of a small region where the gate and the source/drain regions overlap with each other when the n-channel transistor Tr2 is turned off. Thus, the capacitance between the gate and the source/drain regions of the n-channel transistor Tr2 is abruptly reduced. The capacitance of the gate of the n-channel transistor Tr2 corresponds to that between the gate of the n-channel transistor Tr2 and a substrate (channel region). Therefore, the rate of change (inclination) of potential increase in the node ND4 is reduced.

According to the first embodiment, the difference between the potentials of the node ND3 and the boot signal is reduced below the threshold voltage $V_t$ (about 0.7 V) of the n-channel transistor Tr1 with a delay of a prescribed period after the rate of change of potential increase in the node ND4 is reduced. Thus, the n-channel transistor Tr1 enters an OFF-state, whereby the rate of change (inclination) of potential increase in the node ND3 is reduced similarly to the aforementioned case of the node ND2. After this reduction of the rate of change of potential increase, the rate of change of potential increase in the node ND3 is equal to that in the node ND4 after the reduction of the rate of change of potential increase. Therefore, the rate of change of potential increase in the node ND3 exceeds that in the node ND4 for a prescribed period between the reduction of the rate of change of potential increase in the node ND4 and the reduction of that in the node ND3. Thus, the potential comparison circuit 1 enlarges the difference between the potentials of the nodes ND3 and ND4 in this prescribed period. Therefore, the potential comparison circuit 1 enlarges the difference $V_B$ between the potentials of the nodes ND3 and ND4 after termination of the boot period to substantially several times (about five times) the difference $V_A$ (about 0.01 V) between the potential (about 1.51 V) of the node ND3 and the potential (about 1.5 V) of the node ND4 in the initial state. This enlargement of the potential difference varies with the ratio between the capacitance of the node ND3 and the gate capacitance of the n-channel transistor Tr1.

If a potential of about 1.49 V, which is lower than the reference potential $V_{ref}$ (about 1.5 V) by about 0.01 V, is input as the input potential $V_{in}$ in the initial state, the difference $V_A$ between the input potential $V_{in}$ and the reference potential $V_{ref}$ is about 0.01 V. In this case, the difference between the potentials of the node ND3 and the boot signal is reduced below the threshold voltage $V_t$ (about 0.7 V) of the n-channel transistor Tr1 at prescribed timing and the difference between the potentials of the node ND4 and the boot signal is thereafter reduced below the threshold voltage $V_t$ (about 0.7 V) of the n-channel transistor Tr2 with a delay of the prescribed period when the potentials of the nodes ND3 and ND4 are increased at rates of change of potential increase smaller than that of potential increase of the boot signal following the increase of the potential of the boot signal from the level $(V_{ref}-V_t-V_\alpha)$ (about 0.5 V) to the level Vcc (about 3 V), as shown in FIG. 3. In this case, the n-channel transistor Tr1 enters an OFF-state at prescribed timing and the n-channel transistor Tr2 also enters an OFF-state with a delay of a prescribed period, whereby the rate of change of potential increase in the node ND3 is reduced at prescribed timing and that in the node ND4 is also reduced with a delay of a prescribed period. When turning off the n-channel transistors Tr1 and Tr2 for reducing the rates of change of potential increase in the nodes ND3 and ND4, the potential comparison circuit 1 operates similarly to the aforementioned case of receiving the potential slightly higher than the reference potential $V_{ref}$ as the input potential $V_{in}$. The rate of change of potential increase in the node ND4 exceeds that in the node ND3 for the prescribed period between the reduction of the rate of change of potential increase in the node ND3 and the reduction of that in the node ND4. Thus, the potential comparison circuit 1 enlarges the difference between the potentials of the nodes ND4 and ND3 in this prescribed period. Therefore, the potential comparison circuit 1 enlarges the difference $V_B$ (about 0.05 V) between the potentials of the nodes ND3 and ND4 after termination of the boot period to substantially several times (about five times) the difference $V_A$ (about 0.01 V) between the potentials of the nodes ND4 and ND3 in the initial state.

Figure 4:
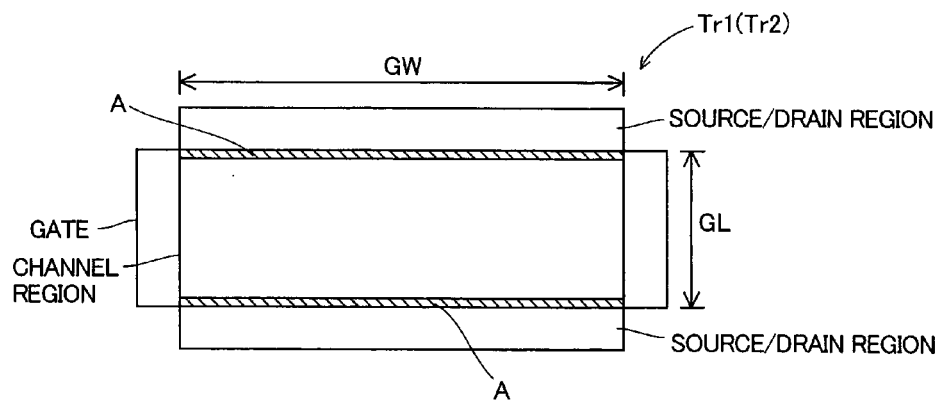
FIG. 4 is a plan view showing the structure of a transistor employed for booting an input potential and a reference potential of the potential comparison circuit according to the first embodiment.
Figure 5:
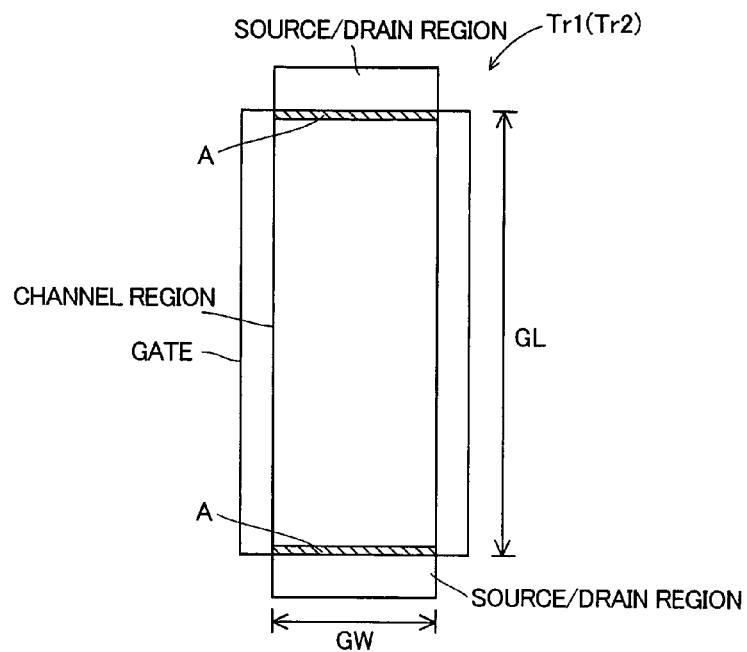
FIG. 5 is a plan view showing the structure of another transistor employed for booting the input potential and the reference potential of the potential comparison circuit according to the first embodiment.
Figure 6:
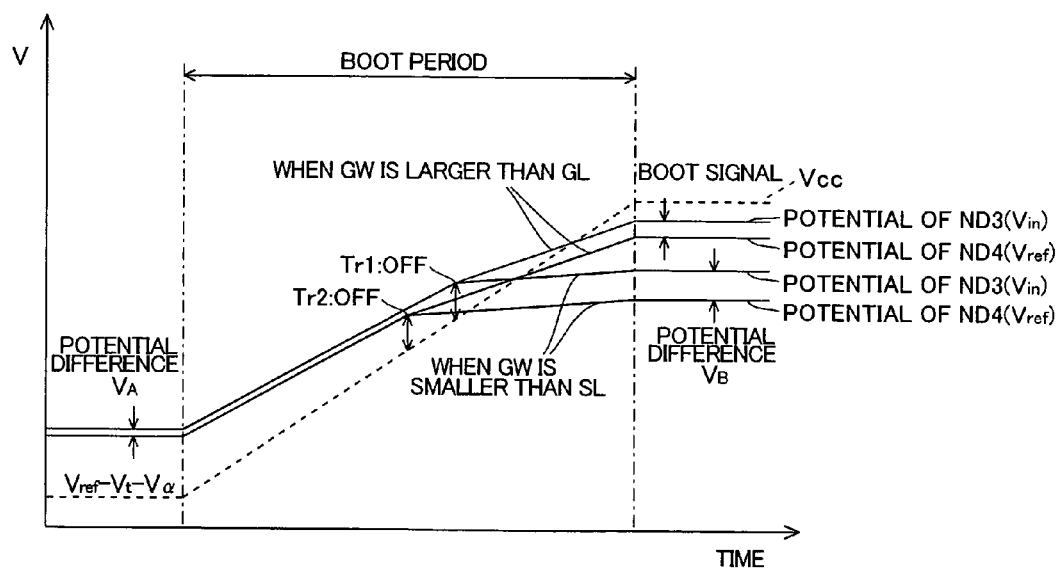
FIG. 6 is a voltage waveform diagram for illustrating operations of the potential comparison circuit according to the first embodiment in cases where the gate widths of the transistors employed for booting the input potential and the reference potential are larger and smaller than the gate lengths thereof respectively.

The degrees of reduction of the rates of change (inclination) of potential increase in the nodes ND3 and ND4 caused by turning off the n-channel transistors Tr1 and Tr2 vary with the sizes of areas where the gates and the source/drain regions overlap with each other in the n-channel transistors Tr1 and Tr2. When the gate width (GW) of the n-channel transistor Tr1 (Tr2) is larger than the gate length (GL) as shown in FIG. 4, for example, the size of areas A where the gate and the source/drain regions overlap with each other is increased as compared with a case where the gate width (GW) of the n-channel transistor Tr1 (Tr2) is smaller than the gate length (GL) as shown in FIG. 5. When the gate width (GW) of the n-channel transistor Tr1 (Tr2) is smaller than the gate length (GL), therefore, the rate of change (inclination) of potential increase in the node ND3 (ND4) is more reduced as compared with the case where the gate width (GW) is larger than the gate length (GL), as shown in FIG. 6. Thus, the potential difference between the nodes ND3 and ND4 is increased after enlargement of the potential difference when the gate width (GW) of the n-channel transistor Tr1 (Tr2) is smaller than the gate length (GL) as compared with the case where the gate width (GW) is larger than the gate length (GL), as shown in FIG. 6. In other words, it is possible to further enlarge the difference between the input potential $V_{in}$ input in the node ND3 and the reference potential $V_{ref}$ input in the node ND4 by forming the n-channel transistors Tr1 and Tr2 so that the gate widths (GW) are smaller than the gate lengths (GL). If the gate lengths (GL) are excessively increased, however, source-to-drain resistance components are disadvantageously increased to deteriorate responsibility of the n-channel transistors Tr1 and Tr2 serving as capacitors.

After the enlargement of the difference between the potential ($V_{in}$) of the node ND3 and the potential ($V_{ref}$) of the node ND4, the sense amplifier 2 (see FIG. 1) compares the potential ($V_{in\alpha}$) of the node ND3 and the potential ($V_{ref\alpha}$) of the node ND4 with each other thereby further enlarging (amplifying) the difference between the potential ($V_{in\alpha}$) of the node ND3 and the potential ($V_{ref\alpha}$) of the node ND4 and determining whether the potential ($V_{in}$) of the node ND3 is higher or lower than the potential ($V_{ref}$) of the node ND4. At this time, the potential comparison circuit 1 activates the sense amplifier 2, thereby turning on the n- and p-channel transistors Tr6 and Tr7 of the sense amplifier 2 and turning off the n- and p-channel transistors Tr5 and Tr8 if the potential ($V_{in\alpha}$) of the node ND3 is higher than the potential ($V_{ref\alpha}$) of the node ND4. Thus, the potential comparison circuit 1 supplies the sense amplifier activation signal SAP of the potential Vcc (about 3 V) to the output line 4 through the p-channel transistor Tr7 while supplying the sense amplifier activation signal SAN of the ground potential (GND: 0 V) to the output line 5 through the n-channel transistor Tr6. If the potential ($V_{in\alpha}$) of the node ND3 is lower than the potential ($V_{ref\alpha}$) of the node ND4, on the other hand, the n- and p-channel transistors Tr5 and Tr8 of the sense amplifier 2 enter ON-states while the n- and p-channel transistors Tr6 and Tr7 enter OFF-states. Thus, the potential comparison circuit 1 supplies the sense amplifier activation signal SAP of the potential Vcc (about 3 V) to the output line 5 through the p-channel transistor Tr8, while supplying the sense amplifier activation signal SAN of the ground potential (GND: 0 V) to the output line 4 through the n-channel transistor Tr5. In other words, the output lines 4 and 5 output the potential Vcc (about 3 V) and the ground potential (GND: 0 V) respectively if the input potential $V_{in}$ is higher than the reference potential $V_{ref}$. If the input potential $V_{in}$ is lower than the reference potential $V_{ref}$ on the other hand, the output lines 4 and 5 output the ground potential (GND: 0 V) and the potential Vcc (about 3 V) respectively. The potential comparison circuit 1 determines whether the input potential $V_{in}$ (potential of the node ND3) is higher or lower than the reference potential $V_{ref}$ (potential of the node ND4) in the aforementioned manner.

According to the first embodiment, as hereinabove described, the potential comparison circuit 1 enlarges the difference between the input potential ($V_{in}$) input in the gate of the n-channel transistor Tr1 and the reference potential ($V_{ref}$) input in the gate of the n-channel transistor Tr2 by increasing the potentials of the pairs of source/drain regions of the n-channel transistors Tr1 and Tr2 serving as capacitors respectively from the level ($V_{ref}-V_t-V_\alpha$) to the level Vcc. Thereafter the potential comparison circuit 1 compares the input potential $V_{in\alpha}$ and the reference potential $V_{ref\alpha}$ with each other through the sense amplifier 2, thereby determining whether the input potential $V_{in}$ is larger or smaller than the reference potential $V_{ref}$. Thus, the potential comparison circuit 1 can more reliably determine whether the input potential $V_{in}$ is higher or lower than the reference potential $V_{ref}$ as compared with the case of comparing the input potential $V_{in}$ and the reference potential $V_{ref}$ by the sense amplifier 2 without enlarging the potential difference. Therefore, the potential comparison circuit 1 can improve the accuracy for determining whether the input potential $V_{in}$ is higher or lower than the reference potential $V_{ref}$. Also when the difference between the input potential $V_{in}$ input in the gate of the n-channel transistor Tr1 and the reference potential $V_{ref}$ input in the gate of the n-channel transistor Tr2 is smaller than the sensitivity of the sense amplifier 2, the sense amplifier 2 receiving the input potential $V_{in\alpha}$ and the reference potential $V_{ref\alpha}$ after enlargement of the potential difference can easily determine whether the input potential $V_{in}$ is higher or lower than the reference potential $V_{ref}$.

Second Embodiment

Figure 7:
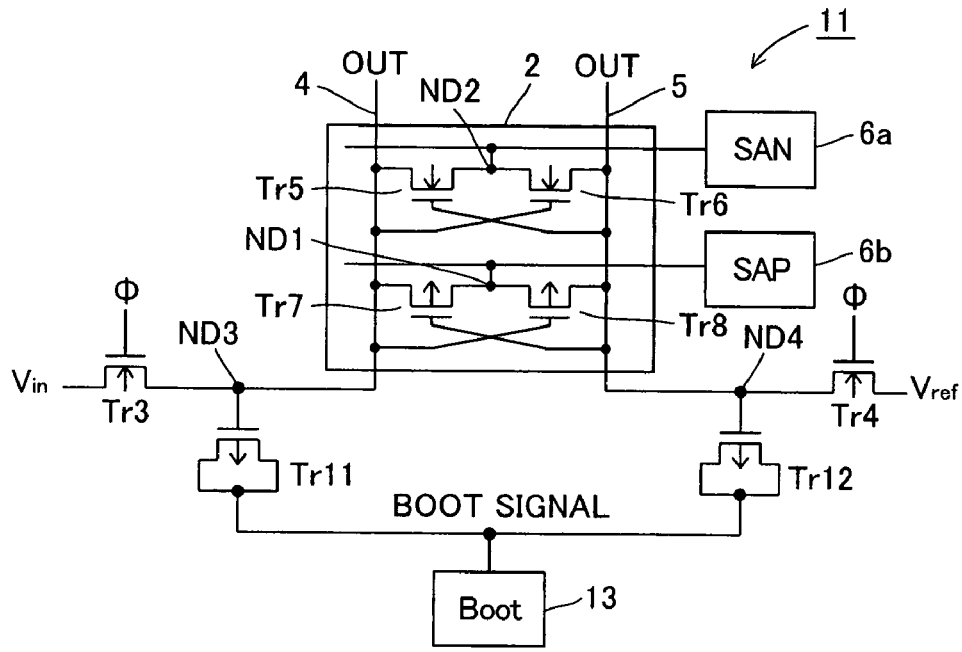
FIG. 7 is a circuit diagram showing the structure of a potential comparison circuit according to a second embodiment of the present invention.

The structure of a potential comparison circuit 11 according to a second embodiment of the present invention is now described with reference to FIG. 7.

Figure 8:
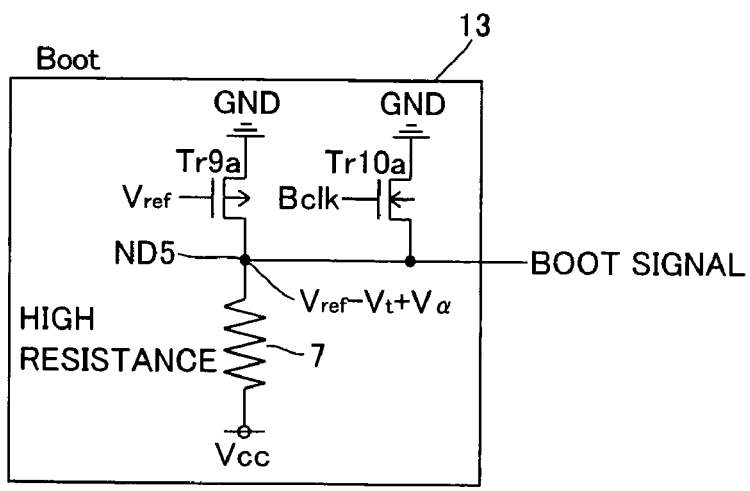
FIG. 8 is a circuit diagram showing the structure of a boot signal generation circuit of the potential comparison circuit according to the second embodiment shown in FIG. 7.

In the potential comparison circuit 11 according to the second embodiment, two transistors serving as capacitors receiving a boot signal are constituted of p-channel transistors, dissimilarly to the potential comparison circuit 1 according to the aforementioned first embodiment. More specifically, the potential comparison circuit 11 according to the second embodiment is constituted of two p-channel transistors Tr11 and Tr12, two n-channel transistors Tr3 and Tr4, a sense amplifier 2, a boot signal generation circuit 13, a SAN circuit 6a and a SAP circuit 6b, as shown in FIG. 7. The p-channel transistor Tr11 is an example of the "first capacitance means" or the "third transistor" in the present invention, and the p-channel transistor Tr12 is an example of the "second capacitance means" or the "fourth transistor" in the present invention. Each of the p-channel transistors Tr11 and Tr12 has a pair of source/drain regions connected with each other, to serve as a capacitor. Further, the p-channel transistors Tr11 and Tr12 have the same threshold voltage $V_t$. The boot signal generation circuit 13 is connected to the pairs of source/drain regions of the p-channel transistors Tr11 and Tr12 respectively. The gate of the p-channel transistor Tr11 is connected to either the source region or the drain region of the n-channel transistor Tr3 and the sense amplifier 2. The gate of the p-channel transistor Tr12 is connected to either the source region or the drain region of the n-channel transistor Tr4 and the sense amplifier 2. The boot signal generation circuit 13 has a structure obtained by interchanging the potential Vcc supplied in the boot signal generation circuit 3 (see FIG. 2) according to the aforementioned first embodiment and the ground potential (GND) with each other, as shown in FIG. 8. Further, p- and n-channel transistors Tr9a and Tr10a substitute for the n- and p-channel transistors Tr9 and Tr10 according to the first embodiment shown in FIG. 2 respectively. The p-channel transistor Tr9a is an example of the "first transistor" in the present invention, and the n-channel transistor Tr10a is an example of the "second transistor" in the present invention. The remaining structure of the potential comparison circuit 11 according to the second embodiment is similar to that of the potential comparison circuit 1 according to the aforementioned first embodiment.

Operations of the potential comparison circuit 11 according to the second embodiment are now described with reference to FIGS. 7 to 9.

The potential comparison circuit 11 according to the second embodiment reduces an input potential $V_{in}$ and a reference potential $V_{ref}$ while enlarging the difference between the input potential $V_{in}$ and the reference potential $V_{ref}$ following reduction of the potential of a boot signal, dissimilarly to the aforementioned first embodiment. More specifically, a high-level clock signal $\Phi$ is input in the gates of the n-channel transistors Tr3 and Tr4 (see FIG. 7) in an initial state, thereby turning on the n-channel transistors Tr3 and Tr4 respectively. Thus, nodes ND3 and ND4 are at the input potential $V_{in}$ and the reference potential $V_{ref}$ respectively. It is assumed that a potential slightly higher than the reference potential $V_{ref}$ is input as the input potential $V_{in}$ in this initial state. It is also assumed that $V_A$ represents the current difference between the input potential $V_{in}$ and the reference potential $V_{ref}$. The reference potential $V_{ref}$ is input in the gate of the p-channel transistor Tr9a of the boot signal generation circuit 13 (see FIG. 8). Thus, the p-channel transistor Tr9a is in an ON-state. The potential of a node ND5 between the p-channel transistor Tr9a and a high resistance 7 is increased from the reference potential $V_{ref}$ by the threshold voltage $|V_t|$ of the p-channel transistor Tr9a, and further increased by a prescribed voltage $V_\alpha$ through the high resistance 7. In other words, the node ND5 is at a potential $(V_{ref}-V_t+V_\alpha)$ ($V_t<0$). In the initial state, a low-level boot clock signal Bclk is input in the gate of the n-channel transistor Tr10a. Thus, the n-channel transistor Tr10a is in an OFF-state. Therefore, the boot signal generation circuit 13 outputs a boot signal of the potential $(V_{ref}-V_t+V_\alpha)$ in the initial state. This boot signal is input in the pairs of source/drain regions of the p-channel transistors Tr11 and Tr12 (see FIG. 7).

The potential ($V_{in}$) of the node ND3 is input in the gate of the p-channel transistor Tr11, while the potential ($V_{ref}$) of the node ND4 is input in the gate of the p-channel transistor Tr12. In the initial state, the difference ($|V_{gs}|$) between the gate potential ($V_{in}$) of the p-channel transistor Tr11 and the potential ($V_{ref}-V_t+V_\alpha$) of the source/drain regions thereof is larger than the threshold voltage $|V_t|$ of the p-channel transistor Tr11. Thus, the p-channel transistor Tr11 is in an ON-state. Further, the difference ($V_{gs}$) between the gate potential ($V_{ref}$) of the p-channel transistor Tr12 and the potential ($V_{ref}-V_t+V_\alpha$) of the source/drain regions thereof is also larger than the threshold voltage $|V_t|$ of the p-channel transistor Tr12. Thus, the p-channel transistor Tr12 is also in an ON-state. Then, a low-level clock signal $\Phi$ is input in the gates of the n-channel transistors Tr3 and Tr4 respectively. Thus, the n-channel transistors Tr3 and Tr4 enter OFF-states. Therefore, the node ND3 enters a floating state while holding the input potential $V_{in}$, while the node ND4 also enters a floating state while holding the reference potential $V_{ref}$.

In a boot period, the boot clock signal Bclk input in the gate of the n-channel transistor Tr10a of the boot signal generation circuit 13 (see FIG. 8) goes high. Thus, a current flows through the n-channel transistor Tr10a, whereby the potential of the boot signal output from the boot signal generation circuit 13 is gradually reduced from the level $(V_{ref}-V_t+V_\alpha)$. Thus, the potentials of the source/drain regions of the p-channel transistors Tr11 and Tr12 (see FIG. 7) are also gradually reduced from the level $(V_{ref}-V_t+V_\alpha)$ respectively. At this time, the potential comparison circuit 11 boots the potentials of the nodes ND3 and ND4 input in the gates of the p-channel transistors Tr11 and Tr12 toward reductive directions through the gate capacitances of the p-channel transistors Tr11 and Tr12 serving as capacitors respectively. Thus, the potentials of the nodes ND3 and ND4 are reduced.

Figure 9:
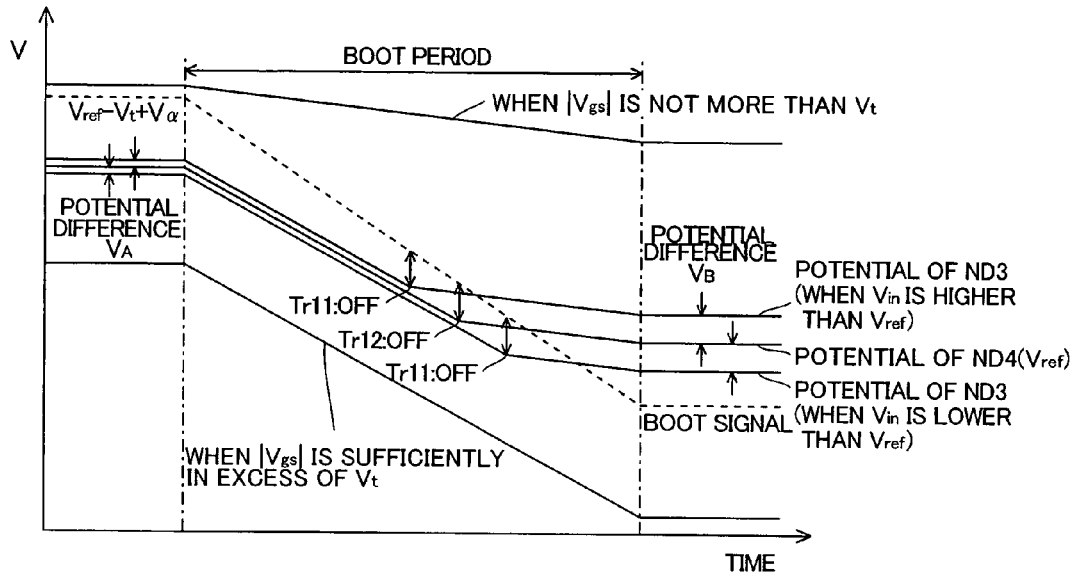
FIG. 9 is a voltage waveform diagram for illustrating operations of the potential comparison circuit according to the second embodiment of the present invention.

At this time, the rate of change (inclination) of potential reduction in the boot signal is larger than the rates of change (inclination) of potential reduction in the nodes ND3 and ND4, as shown in FIG. 9. This is because the potential comparison circuit 11 distributes charges from the gate capacitances of the p-channel transistors Tr11 and Tr12 to the input capacitance of the sense amplifier 2 and a wiring capacitance or the like when booting the potentials of the nodes ND3 and ND4 through the gate capacitances of the p-channel transistors Tr11 and Tr12, similarly to the aforementioned first embodiment. As the potentials of the boot signal and the nodes ND3 and ND4 are reduced, the difference therebetween is reduced due to the rate of change of the potential reduction in the boot signal larger than those of the potential reduction in the nodes ND3 and ND4. The difference between the potentials of the node ND3 and the boot signal is reduced below the threshold voltage $|V_t|$ of the p-channel transistor Tr11 at prescribed timing, thereby turning off the p-channel transistor Tr11. Thus, the capacitance between the gate and the source/drain regions of the p-channel transistor Tr11 serving as a capacitor is abruptly reduced. Therefore, the rate of change (inclination) of potential reduction in the node ND3 is reduced.

According to the second embodiment, the difference between the potentials of the node ND4 and the boot signal is reduced below the threshold voltage $|V_t|$ of the p-channel transistor Tr12 with a delay of a prescribed period after the rate of change of potential reduction in the node ND3 is reduced. Thus, the p-channel transistor Tr12 enters an OFF-state, whereby the rate of change (inclination) of potential reduction in the node ND4 is reduced similarly to the aforementioned case of the node ND3. After this reduction of the rate of change of potential reduction, the rate of change of potential reduction in the node ND4 is equal to that in the node ND3 after the reduction of the rate of change of potential reduction. Therefore, the rate of change of potential reduction in the node ND4 exceeds that in the node ND3 for a prescribed period between the reduction of the rate of change of potential reduction in the node ND3 and the reduction of that in the node ND4. Thus, the potential comparison circuit 11 enlarges the difference between the potentials of the nodes ND3 and ND4 in this prescribed period. Therefore, the potential comparison circuit 11 enlarges the difference $V_B$ between the potentials of the nodes ND3 and ND4 after termination of the boot period to substantially several times the difference $V_A$ between the potentials of the nodes ND3 and ND4 in the initial state.

If a potential slightly lower than the reference potential $V_{ref}$ is input as the input potential $V_{in}$ in the initial state, the difference between the potentials of the node ND4 and the boot signal is reduced below the threshold voltage $|V_t|$ of the p-channel transistor Tr12 at prescribed timing and the difference between the potentials of the node ND3 and the boot signal is thereafter reduced below the threshold voltage $|V_t|$ of the p-channel transistor Tr11 with a delay of a prescribed period when the potentials of the nodes ND3 and ND4 are reduced at rates of change of potential reduction smaller than that in the boot signal following reduction of the potential of the boot signal from the level $(V_{ref}-V_t+V_\alpha)$ $(V_t<0)$. In this case, the p-channel transistor Tr12 enters an OFF-state at prescribed timing and the p-channel transistor Tr11 thereafter also enters an OFF-state with a delay of a prescribed period, whereby the rate of change of potential reduction in the node ND4 is reduced at prescribed timing and that in the node ND3 is thereafter also reduced with a delay of a prescribed period. When turning off the p-channel transistors Tr11 and Tr12 for reducing the rates of change of potential reduction in the nodes ND3 and ND4, the potential comparison circuit 11 operates similarly to the aforementioned case of receiving the potential slightly higher than the reference potential $V_{ref}$ as the input potential $V_{in}$. The rate of change of potential reduction in the node ND3 exceeds that in the node ND4 for the prescribed period between the reduction of the rate of change of potential reduction in the node ND4 and the reduction of that in the node ND3. Thus, the potential comparison circuit 11 enlarges the difference between the potentials of the nodes ND4 and ND3 in this prescribed period. Therefore, the potential comparison circuit 11 enlarges the difference $V_B$ between the potentials of the nodes ND4 and ND3 after termination of the boot period to substantially several times the difference $V_A$ between the potential $(V_{ref})$ of the node ND4 and the potential $(V_{in})$ of the node ND3 in the initial state.

After the potential comparison circuit 11 enlarges the difference between the potentials of the nodes ND3 and ND4, the sense amplifier 2 (see FIG. 7) compares these potentials with each other thereby further enlarging (amplifying) the difference between the potentials of the nodes ND3 and ND4 and determining whether the potential of the node ND3 is higher or lower than that of the node ND4. At this time, the sense amplifier 2 operates similarly to the sense amplifier 2 of the potential comparison circuit 1 according to the aforementioned first embodiment shown in FIG. 1.

According to the second embodiment, as hereinabove described, the potential comparison circuit 11 enlarges the difference between the input potential $V_{in}$ input in the gate of the p-channel transistor Tr11 and the reference potential $V_{ref}$ input in the gate of the p-channel transistor Tr12 by reducing the potentials of the pairs of source/drain regions of the p-channel transistors Tr11 and Tr12 serving as capacitors from the level $(V_{ref}-V_t-V_\alpha)$ $(V_t<0)$. Thereafter the potential comparison circuit 11 compares the input potential $(V_{in\alpha})$ and the reference potential $(V_{ref\alpha})$ with each other through the sense amplifier 2 for determining whether the input potential $(V_{in})$ is larger or smaller than the reference potential $(V_{ref})$. Thus, the potential comparison circuit 11 can more reliably determine whether the input potential $V_{in}$ is higher or lower than the reference potential $V_{ref}$ as compared with a case of comparing the input potential $V_{in}$ and the reference potential $V_{ref}$ with each other by the sense amplifier 2 without enlarging the potential difference. Therefore, the potential comparison circuit 11 can improve the accuracy for determining whether the input potential $V_{in}$ is higher or lower than the reference potential $V_{ref}$. Also when the difference between the input potential $V_{in}$ input in the gate of the p-channel transistor Tr11 and the reference potential $V_{ref}$ input in the gate of the p-channel transistor Tr12 is smaller than the sensitivity of the sense amplifier 2, the sense amplifier 2 receiving the input potential $(V_{in\alpha})$ and the reference potential $(V_{ref\alpha})$ after enlargement of the potential difference can easily determine whether the input potential $V_{in}$ is higher or lower than the reference potential $V_{ref}$. While the second embodiment has been described with reference to the absolute value $|V_{gs}|$ of the potential difference between the gates and the source/drain regions of the p-channel transistors Tr11 and Tr12, the p-channel transistors Tr11 and Tr12 enter OFF-states also when the potential difference $V_{gs}$ is positive and in excess of the threshold voltage $|V_t|$.

Third Embodiment

Figure 10:
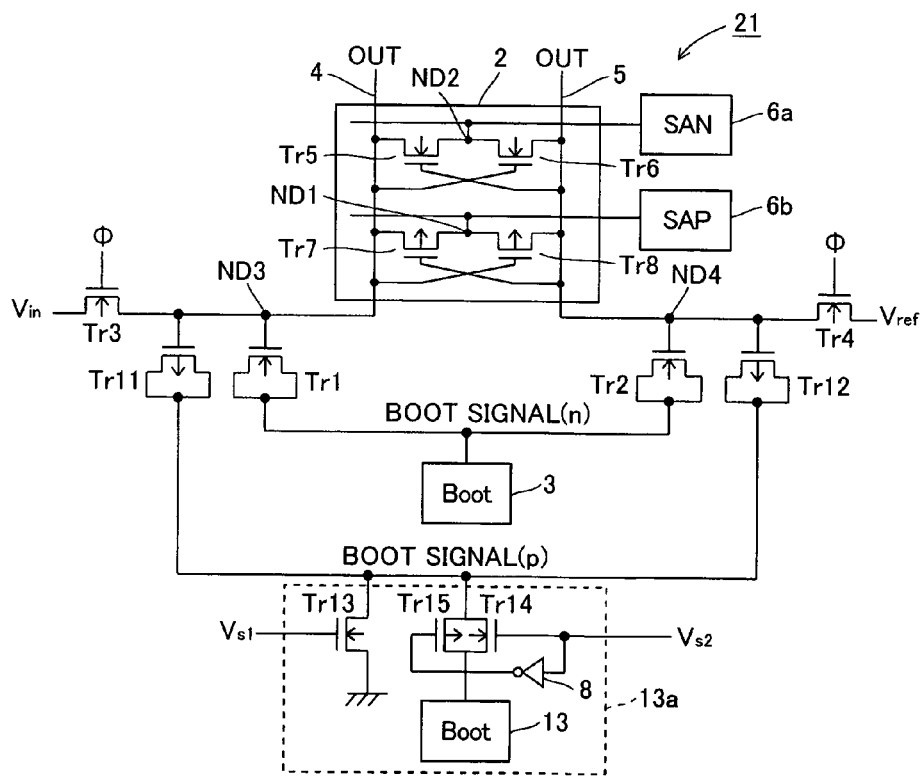
FIG. 10 is a circuit diagram showing the structure of a potential comparison circuit according to a third embodiment of the present invention.

The structure of a potential comparison circuit 21 according to a third embodiment of the present invention is now described with reference to FIG. 10.

The potential comparison circuit 21 according to the third embodiment is so structured as to enlarge the difference between an input potential $V_{in}$ and a reference potential $V_{ref}$ while increasing the input potential $V_{in}$ and the reference potential $V_{ref}$ and thereafter further enlarge the difference between the input potential $(V_{in\alpha})$ and the reference potential $(V_{ref\alpha})$ while reducing the input potential $(V_{in\alpha})$ and the reference potential $(V_{ref\alpha})$ after the enlargement of the potential difference. More specifically, the potential comparison circuit 21 according to the third embodiment is constituted of n-channel transistors Tr1 to Tr4, p-channel transistors Tr11 and Tr12, a sense amplifier 2, a boot signal generation circuit 3, a boot signal generation circuit part 13a, a SAN circuit 6a and a SAP circuit 6b, as shown in FIG. 10. The gates of the n- and p-channel transistors Tr1 and Tr11 are connected to either the source region or the drain region of the n-channel transistor Tr3 and the sense amplifier 2 respectively. In other words, the gates of the n- and p-channel transistors Tr1 and Tr11 are connected to a node ND3 receiving the input potential $V_{in}$ through the n-channel transistor Tr3 respectively. The gates of the n- and p-channel transistors Tr2 and Tr12 are connected to either the source region or the drain region of the n-channel transistor Tr4 and the sense amplifier 2 respectively. In other words, the gates of the n- and p-channel transistors Tr2 and Tr12 are connected to a node ND4 receiving the reference potential $V_{ref}$ through the n-channel transistor Tr4 respectively.

The boot signal generation circuit part 13a is constituted of the boot signal generation circuit 13, n-channel transistors Tr13 and Tr14, a p-channel transistor Tr15 and an inverter circuit 8. The circuit structure of the boot signal generation circuit 13 according to the third embodiment is similar to that of the boot signal generation circuit 13 according to the second embodiment shown in FIG. 8. Either the source regions or the drain regions of the p-channel transistors Tr13 and Tr14 and the p-channel transistor Tr15 are connected to either the source regions or the drain regions of the p-channel transistors Tr11 and Tr12 respectively. Either the drain region or the source region of the n-channel transistor Tr13 is grounded, while a control signal $V_{s1}$ is input in the gate thereof. Either the drain regions or the source regions of the n- and p-channel transistors Tr14 and Tr15 are supplied with a boot signal from the boot signal generation circuit 13. Another control signal $V_{s2}$ is input in the gate of the n-channel transistor Tr14, while an inverted control signal/$V_{s2}$ obtained by inverting the control signal $V_{s2}$ through the inverter circuit 8 is input in the gate of the p-channel transistor Tr15.

The potential comparison circuit 21 according to the third embodiment is formed to enlarge the difference between the potentials of the nodes ND3 and ND4 while increasing the potentials of the nodes ND3 and ND4 receiving the input potential $V_{in}$ and the reference potential $V_{ref}$ respectively through the boot signal generation circuit 3 and the n-channel transistors Tr1 and Tr2. The potential comparison circuit 21 is formed to further enlarge the difference between the potentials of the nodes ND3 an ND4 while reducing the potentials of the nodes ND3 and ND4 through the boot signal generation circuit part 13a and the p-channel transistors Tr11 and Tr12 after the enlargement of the potential difference. The remaining structure of the potential comparison circuit 21 according to the third embodiment is similar to that of the potential comparison circuit 1 according to the aforementioned first embodiment.

Operations of the potential comparison circuit 21 according to the third embodiment are now described with reference to FIGS. 10 and 11.

Figure 11:
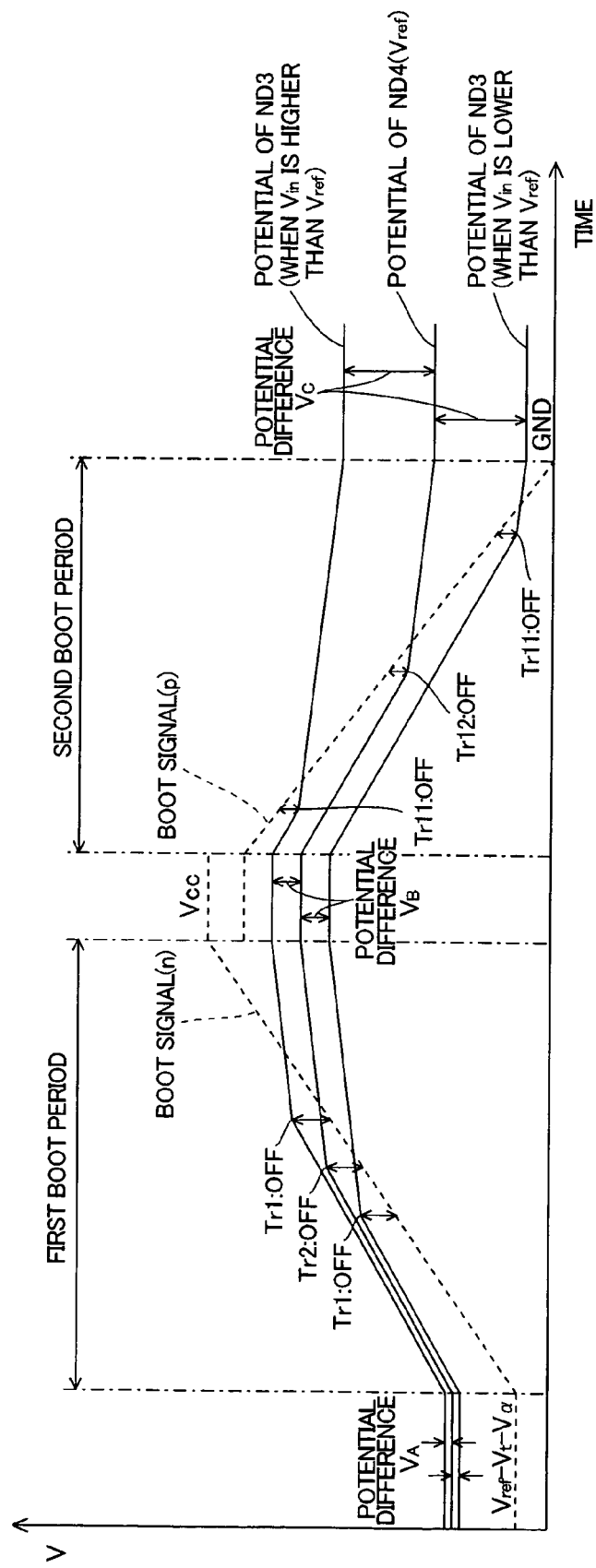
FIG. 11 is a voltage waveform diagram for illustrating operations of the potential comparison circuit according to the third embodiment of the present invention.

The potential comparison circuit 21 according to the third embodiment enlarges the potential difference between the nodes ND3 and ND4 while increasing the potentials of the nodes ND3 and ND4 receiving the input potential $V_{in}$ and the reference potential $V_{ref}$ respectively in a first boot period and thereafter further enlarges the potential difference between the nodes ND3 and ND4 while reducing the potentials of the nodes ND3 and ND4 in a second boot period, as shown in FIG. 11. More specifically, the n-channel transistors Tr3 and Tr4 receiving a high-level clock signal Φ in the gates thereof are in ON-states respectively in an initial state. Thus, the nodes ND3 and ND4 are at the input potential $V_{in}$ and the reference potential $V_{ref}$ respectively. The boot signal generation circuit 3 inputs a boot signal (n) of a potential $(V_{ref}-V_t-V_\alpha)$ in the source/drain regions of the n-channel transistors Tr1 and Tr2. Thus, the n-channel transistors Tr1 and Tr2 are in ON-states in the initial state. The n-channel transistor Tr13 of the boot signal generation circuit part 13a receives a low-level control signal $V_{s1}$, to enter an OFF-state. A high-level control signal $V_{s2}$ is input in the gate of the n-channel transistor Tr14, while a low-level inverted control signal/$V_{s2}$ is input in the gate of the p-channel transistor Tr15 through the inverter circuit 8. Thus, a boot signal (p) of a potential $(V_{ref}-V_t+V_\alpha)$ $(V_t<0)$ output from the boot signal generation circuit 13 is input in the source/drain regions of the p-channel transistors Tr11 and Tr12 through the n- and p-channel transistors Tr14 and Tr15 respectively. Therefore, the p-channel transistors Tr11 and Tr12 are in ON-states in the initial state.

Then, the control signal $V_{s2}$ goes low. Thus, the n-channel transistor Tr14 is turned off, while the p-channel transistor Tr15 receiving the inverted control signal/$V_{s2}$ in the gate thereof is also turned off. Therefore, the source/drain regions of the p-channel transistors Tr11 and Tr12 enter floating states. Then, a low-level clock signal Φ is input in the n-channel transistors Tr3 and Tr4, thereby bringing the nodes ND3 and ND4 into floating states. In the first boot period, the potential comparison circuit 21 increases the potential of the boot signal (n) input in the source/drain regions of the n-channel transistors Tr1 and Tr2 from the boot signal generation circuit 3 from the level $(V_{ref}-V_t-V_\alpha)$ to a level Vcc. Thus, the potential comparison circuit 21 increases the potentials of the nodes ND3 and ND4 and enlarges the difference $V_A$ therebetween to difference $V_B$. At this time, the potential comparison circuit 21 operates similarly to the potential comparison circuit 1 according to the aforementioned first embodiment. When increasing the potentials of the nodes ND3 and ND4, the potential comparison circuit 21 also increases the potentials of the source/drain regions of the floating p-channel transistors Tr11 and Tr12 while holding the p-channel transistors Tr11 and Tr12 in ON-states. Thus, the potential comparison circuit 21 increases the potentials of the source/drain regions of the p-channel transistors Tr11 and Tr12 to a prescribed level higher than the potentials of the nodes ND3 and ND4 for holding the p-channel transistors Tr11 and Tr12 in the ON-states when terminating the first boot period.

In the second boot period, the control signal $V_{s1}$ input in the gate of the n-channel transistor Tr13 of the boot signal generation circuit part 13a goes high. Thus, the potential comparison circuit 21 reduces the potential of the boot signal (p) input in the source/drain regions of the p-channel transistors Tr11 and Tr12 to the ground potential (GND) through the n-channel transistor Tr13. Thus, the potential comparison circuit 21 reduces the potentials of the nodes ND3 and ND4 and further enlarges the difference $V_B$ therebetween to difference Vc shown in FIG. 11 in the second boot period. The potential comparison circuit 21 reduces the potentials of the nodes ND3 and ND4 thereby enlarging the potential difference similarly to the potential comparison circuit 11 according to the aforementioned second embodiment. According to the third embodiment, the potential comparison circuit 21 enlarges the difference $V_A$ between the input potential $V_{in}$ and the reference potential $V_{ref}$ in the initial state to the difference Vc of about 20 times the difference $V_A$.

According to the third embodiment, as hereinabove described, the potential comparison circuit 21 can further enlarge the difference between the input potential $V_{in}$ input in the gate of the n-channel transistor Tr1 and the reference potential $V_{ref}$ input in the gate of the n-channel transistor Tr2 in the initial state by enlarging the difference between the input potential $V_{in}$ input in the gate of the n-channel transistor Tr1 and the reference potential $V_{ref}$ input in the gate of the n-channel transistor Tr2 following the operation of increasing the potentials of the source/drain regions of the n-channel transistors Tr1 and Tr2 through the boot signal (n) from the boot signal generation circuit 3 and thereafter further enlarging the difference between the input potential ($V_{in\alpha}$) and the reference potential ($V_{ref\alpha}$) after the enlargement of the potential difference following the operation of reducing the potential of the boot signal (p) input in the source/drain regions of the p-channel transistors Tr11 and Tr12 from the boot signal generation circuit part 13a to the ground level. Thus, the potential comparison circuit 21 according to the third embodiment can further improve the accuracy for determining whether the prescribed input potential is higher or lower than the reference potential.

The remaining effects of the third embodiment are similar to those of the aforementioned first embodiment.

Fourth Embodiment

A potential comparison circuit 31 according to a fourth embodiment of the present invention is applied to a DRAM. The structure of the DRAM according to the fourth embodiment is now described with reference to FIGS. 12 and 13.

Figure 12:
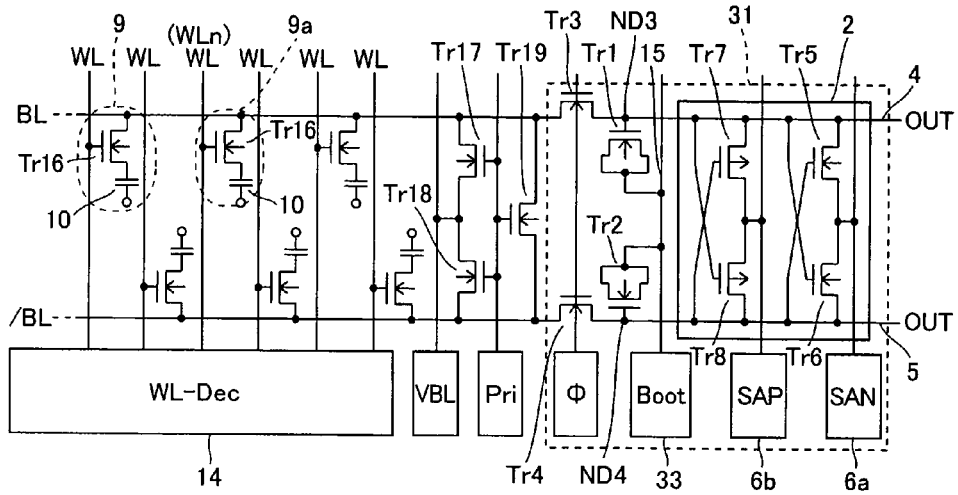
FIG. 12 is a circuit diagram showing the structure of a DRAM according to a fourth embodiment of the present invention.

The RAM according to the fourth embodiment is formed to compare the potential of a bit line corresponding to data held in capacitors of memory cells and a reference potential with each other by the potential comparison circuit 31 and determine whether the potential of the bit line is higher or lower than the reference potential in data reading. More specifically, a bit line pair consisting of a bit line BL and an inverted bit line/BL and a plurality of word lines WL are provided perpendicularly to each other, as shown in FIG. 12. The bit line BL and the inverted bit line/BL are examples of the "data line" in the present invention. Memory cells 9 are provided on positions where the word lines WL and the pair of bit lines BL and /BL intersect with each other respectively. Each memory cell 9 is formed by an n-channel transistor Tr16 and a capacitor 10 holding data. The capacitor 10 is an example of the "storage means" in the present invention. The gate of the n-channel transistor Tr16 of each memory cell 9 is connected to the corresponding word line WL, and either the source region or the drain region thereof is connected to the bit line BL or the inverted bit line/BL. The capacitor 10 is connected to either the drain region or the source region of the n-channel transistor Tr16. All word lines WL are connected to a word line decoder 14 for selecting a prescribed word line WL in data reading and data writing.

Either the source region or the drain region of an n-channel transistor Tr17 is connected to the bit line BL. Either the source region or the drain region of an n-channel transistor Tr18 is connected to the inverted bit line/BL. A signal VBL is input in either the drain regions or the source regions of the n-channel transistors Tr17 and Tr18 respectively. A precharge signal Pri is input in the gates of the n-channel transistors Tr17 and Tr18 respectively. Either the source region or the drain region of an n-channel transistor Tr19 is connected to the bit line BL, while either the drain region or the source region of the n-channel transistor Tr19 is connected to the inverted bit line/BL. The precharge signal Pri is input also in the gate of the n-channel transistor Tr19. The potential comparison circuit 31 is connected to ends of the pair of bit lines BL and /BL. Either the source region or the drain region of an n-channel transistor Tr3 of the potential comparison circuit 31 is connected to the bit line BL, while either the source region or the drain region of another n-channel transistor Tr4 is connected to the inverted bit line/BL. The potential comparison circuit 31 is structured similarly to the potential comparison circuit 1 according to the aforementioned first embodiment shown in FIG. 1, except the circuit structure of a boot signal generation circuit 33.

Figure 13:
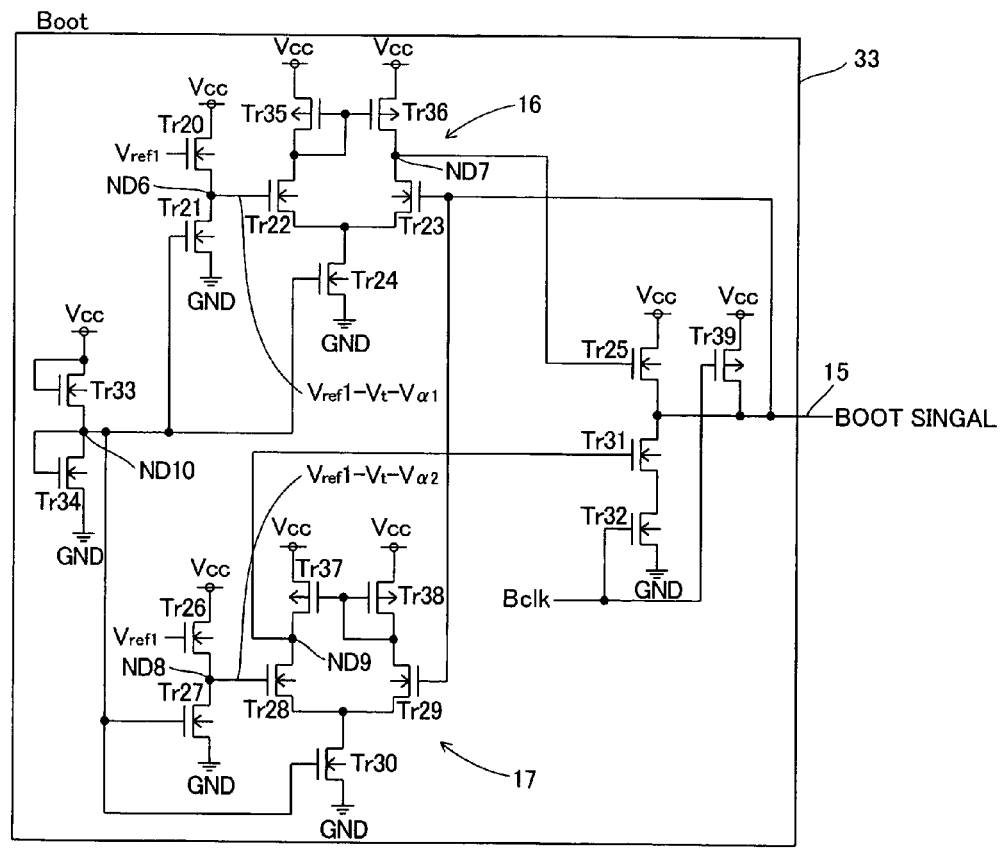
FIG. 13 is a circuit diagram showing the structure of a boot signal generation circuit of the DRAM according to the fourth embodiment shown in FIG. 12.

The boot signal generation circuit 33 is constituted of 15 n-channel transistors Tr20 to Tr34 and five p-channel transistors Tr35 to Tr39, as shown in FIG. 13. The n-channel transistors Tr20 and Tr26 are examples of the "first transistor" in the present invention, and the p-channel transistor Tr39 is an example of the "second transistor" in the present invention. The n-channel transistors Tr21 and Tr27 are examples of the "voltage change means" in the present invention. The n-channel transistor Tr20 has the same threshold voltage $V_t$ as the n-channel transistors Tr1 and Tr2 (see FIG. 12). A reference potential $V_{ref1}$ is input in the gate of the n-channel transistor Tr20. A potential Vcc is supplied to either the source region or the drain region of the n-channel transistor Tr20, while either the source region or the drain region of the n-channel transistor Tr21 is connected to either the drain region or the source region of the n-channel transistor Tr20. Either the drain region or the source region of the n-channel transistor Tr21 is supplied with the ground potential (GND). The gate of the n-channel transistor Tr22 is connected to a node ND6 between the n-channel transistors Tr20 and Tr21. Either the source region or the drain region of the n-channel transistor Tr23 is connected to either the source region or the drain region of the n-channel transistor Tr22. Either the source regions or the drain regions of the n-channel transistors Tr22 and Tr23 are connected to either the source region or the drain region of the n-channel transistor Tr24. Either the drain region or the source region of the n-channel transistor Tr24 is supplied with the ground potential (GND). Either the source region or the drain region of the p-channel transistor Tr35 is connected to either the drain region or the source region of the n-channel transistor Tr22. Either the source region or the drain region of the p-channel transistor Tr35 is connected with the gate thereof. Either the drain region or the source region of the p-channel transistor Tr35 is supplied with the potential Vcc. Either the drain region or the source region of the n-channel transistor Tr23 is connected with either the source region or the drain region of the p-channel transistor Tr36. Either the drain region or the source region of the p-channel transistor Tr36 is supplied with the potential Vcc, while the gate of the p-channel transistor Tr36 is connected to the gate of the p-channel transistor Tr35. The gate of the n-channel transistor Tr23 is connected with an output line 15 outputting a boot signal from the boot signal generation circuit 33. Thus, the boot signal is output through the output line 15 and input in the gate of the n-channel transistor Tr23. The gate of the n-channel transistor Tr25 is connected to a node ND7 between the n-channel transistor Tr23 and the p-channel transistor Tr36. Either the source region or the drain region of the n-channel transistor Tr25 is supplied with the potential Vcc, while either the drain region or the source region thereof is connected to the output line 15. The n-channel transistors Tr22 to Tr24 and the p-channel transistors Tr35 and Tr36 constitute a comparator 16. This comparator 16 compares a potential input in the gate of the n-channel transistor Tr22 and that of the boot signal input in the gate of the n-channel transistor Tr23 with each other for outputting a high-level signal from the node ND7 to the gate of the n-channel transistor Tr25 if the potential input in the gate of the n-channel transistor Tr22 is higher than that of the boot signal while outputting a low-level potential from the node ND7 to the gate of the n-channel transistor Tr25 if the potential of the boot signal is higher than the potential input in the gate of the n-channel transistor Tr22.

The n-channel transistor Tr26 has the same threshold voltage $V_t$ as the n-channel transistors Tr1 and Tr2 (see FIG. 12). The reference potential $V_{ref1}$ is input in the gate of the n-channel transistor Tr26. The gate of the n-channel transistor Tr28 is connected to a node ND8 between the n-channel transistors Tr26 and Tr27. Either the source region or the drain region of the p-channel transistor Tr37 is connected to either the source region or the drain region of the n-channel transistor Tr28. The gate of the p-channel transistor Tr37 is connected to the gate of the p-channel transistor Tr38. The gate of the p-channel transistor Tr38 is connected with either the source region or the drain region, which in turn is connected with either the source region or the drain region of the n-channel transistor Tr29.

The gate of the n-channel transistor Tr29 is connected with the output line 15. Thus, the boot signal is output through the output line 15, and input in the gate of the n-channel transistor Tr29. The gate of the n-channel transistor Tr31 is connected to a node ND9 between the n-channel transistor Tr28 and the p-channel transistor Tr37. Either the source region or the drain region of the n-channel transistor Tr31 is connected to the output line 15, while either the drain region or the source region thereof is connected to either the source region or the drain region of the n-channel transistor Tr32. The n-channel transistors Tr28 to Tr30 and the p-channel transistors Tr37 and Tr38 constitute a comparator 17. This comparator 17 compares a potential input in the gate of the n-channel transistor Tr28 and the potential of the boot signal input in the gate of the n-channel transistor Tr29 with each other for outputting a low-level potential from the node ND9 to the gate of the n-channel transistor Tr31 if the potential input in the gate of the n-channel transistor Tr28 is higher than that of the boot signal. If the potential of the boot signal is higher than the potential input in the gate of the n-channel transistor Tr28, on the other hand, the comparator 17 outputs a high-level potential from the node ND9 to the gate of the n-channel transistor Tr31. The remaining structures of the n-channel transistors Tr26 to Tr30 and the p-channel transistors Tr37 and Tr38 are similar to those of the n-channel transistors Tr20 to Tr24 and the p-channel transistors Tr35 and Tr36 described above respectively.

Either the drain region or the source region of the n-channel transistor Tr32 is supplied with the ground potential (GND). A boot clock signal Bclk is input in the gates of the n-channel transistor Tr32 and the p-channel transistor Tr39. Either the source region or the drain region of the p-channel transistor Tr39 is supplied with the potential Vcc, while either the drain region or the source region thereof is connected to the output line 15. The gate and either the source region or the drain region of the n-channel transistor Tr33 are supplied with the potential Vcc, while either the drain region or the source region thereof is connected to the gate and either the source region or the drain region of the n-channel transistor Tr34. Either the drain region or the source region of the n-channel transistor Tr34 is supplied with the ground potential (GND). The gates of the n-channel transistors Tr21, Tr24, Tr27 and Tr30 are connected to a node ND10 between the n-channel transistors Tr33 and Tr34 respectively.

Figure 14:
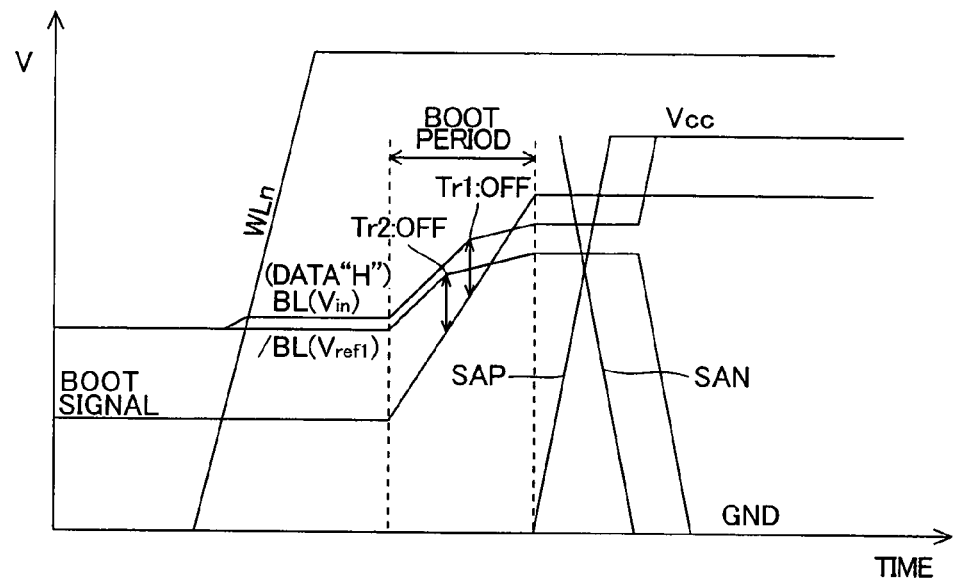
FIGS. 14 and 15 are voltage waveform diagrams for illustrating operations of the DRAM according to the fourth embodiment.
Figure 15:
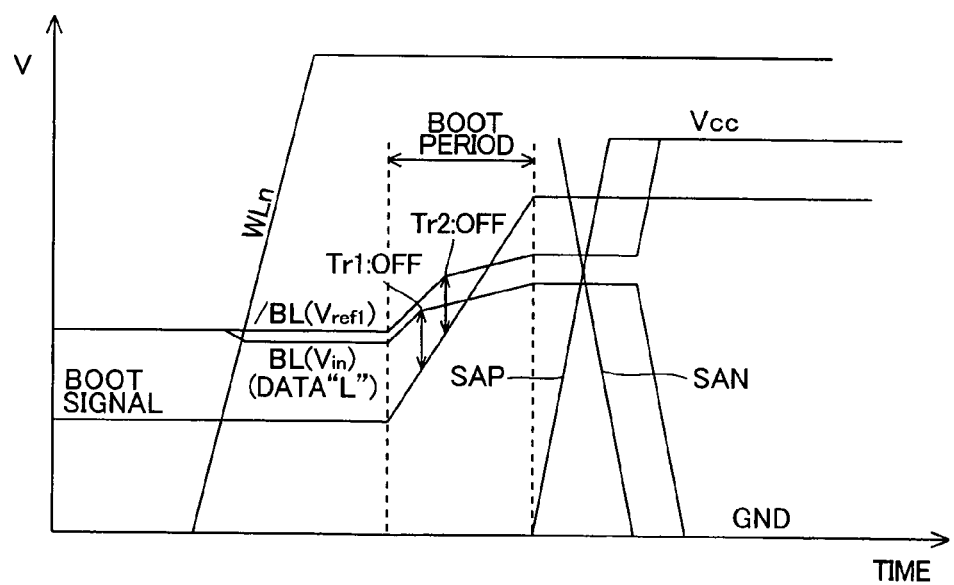

FIGS. 14 and 15 are voltage waveform diagrams for illustrating operations of the DRAM according to the fourth embodiment of the present invention. The operations of the DRAM according to the fourth embodiment are now described with reference to FIGS. 12 to 15.

In the DRAM according to the fourth embodiment, a high-level boot clock signal Bclk is input in the gates of the n- and p-channel transistors Tr32 and Tr39 respectively in an initial state of data reading. Thus, the n- and p-channel transistors Tr32 and Tr39 are in ON- and OFF-states respectively. In the initial state, the reference potential $V_{ref1}$ ($V_{BL} \approx \frac{1}{2}$ Vcc) is input in the gate of the n-channel transistor Tr20 (see FIG. 13) of the boot signal generation circuit 33. Thus, the n-channel transistor Tr20 is in an ON-state. Further, an intermediate potential between the potential Vcc and the ground potential (GND) decided by the resistances of the n-channel transistors Tr33 and Tr34 is input in the gate of the n-channel transistor Tr21 from the node ND10. Thus, the n-channel transistor Tr21 is weakly in an ON-state. Therefore, the potential of the node ND6 between the n-channel transistors Tr20 and Tr21 is reduced from the reference potential $V_{ref1}$ ($V_{BL}$) by the threshold voltage $V_t$ of the n-channel transistor Tr20, and further reduced by a prescribed voltage $V_{\alpha 1}$ through the n-channel transistor Tr21. Thus, a potential ($V_{ref1}-V_t-V_{\alpha 1}$ ($V_{BL}-V_t-V_{\alpha 1}$)) is input in the gate of the n-channel transistor Tr22 from the node ND6.

The comparator 16 compares the potential ($V_{BL}-V_t-V_{\alpha 1}$) input in the gate of the n-channel transistor Tr22 and the potential of the boot signal input in the gate of the n-channel transistor Tr23 with each other. At this time, the n-channel transistor Tr24 is in an ON-state due to the intermediate potential between the potential Vcc and the ground potential (GND) input in the gate thereof from the node ND10. If the potential ($V_{BL}-V_t-V_{\alpha 1}$) input in the gate of the n-channel transistor Tr22 is higher than the potential of the boot signal input in the gate of the n-channel transistor Tr23, the n-channel transistor Tr23 operates in an OFF-direction and the n-channel transistor Tr22 strongly enters an ON-state, whereby a low-level potential is input in the gates of the p-channel transistors Tr35 and Tr36 through the ON-state n-channel transistors Tr24 and Tr22. Thus, the p-channel transistor Tr36 strongly enters an ON-state and the n-channel transistor Tr23 operates in an OFF-direction, whereby a high-level potential is input in the gate of the n-channel transistor Tr25 from the node ND7 through the p-channel transistor Tr36. In this case, the n-channel transistor Tr25 enters an ON-state. If the potential of the boot signal input in the gate of the n-channel transistor Tr23 is higher than the potential ($V_{BL}-V_t-V_{\alpha 1}$) input in the gate of the n-channel transistor Tr22, on the other hand, the n-channel transistor Tr23 enters an ON-state while the p-channel transistor Tr36 does not enter a strong ON-state, whereby a low-level potential is input in the gate of the n-channel transistor Tr25 from the node ND7 through the ON-state n-channel transistors Tr24 and Tr23. In this case, the n-channel transistor Tr25 enters an OFF-state.

In the initial state, further, the reference potential $V_{ref1}$ ($V_{BL}$) is input in the gate of the n-channel transistor Tr26. Thus, the n-channel transistor Tr26 is in an ON-state. In addition, the intermediate potential between the potential Vcc and the ground potential (GND) is input in the gate of the n-channel transistor Tr27 from the node ND10. Thus, the n-channel transistor Tr27 is weakly in an ON-state. Therefore, the potential of the node ND8 between the n-channel transistors Tr26 and Tr27 is reduced from the reference potential $V_{ref1}$ ($V_{BL}$) by the threshold voltage $V_t$ of the n-channel transistor Tr26, and further reduced by a prescribed voltage $V_{\alpha 2}$ through the n-channel transistor Tr27. Thus, a potential ($V_{ref1}-V_t-V_{\alpha 2}$ ($V_{BL}-V_t-V_{\alpha 2}$)) is input in the gate of the n-channel transistor Tr28 from the node ND8. In the n-channel transistor Tr27, the ratio (GW/GL) of the gate width to the gate length is smaller than that in the n-channel transistor Tr21, so that the voltage $V_{\alpha 2}$ reduced through the n-channel transistor Tr27 is smaller than the voltage Val reduced through the n-channel transistor Tr21. Thus, the potential ($V_{ref1}-V_t-V_{\alpha 2}(V_{BL}-V_t-V_{\alpha 2})$) input in the gate of the n-channel transistor Tr28 is higher than the potential ($V_{ref1}-V_t-V_{\alpha 1}$ ($V_{BL}-V_t-V_{\alpha 1}$)) input in the gate of the n-channel transistor Tr22.

The comparator 16 compares a potential (½ Vcc–$V_t$–$V_{\alpha 2}$) input in the gate of the n-channel transistor Tr28 and the potential of the boot signal input in the gate of the n-channel transistor Tr29 with each other. At this time, the comparator 17 operates similarly to the aforementioned comparator 16. If the potential (½ Vcc–$V_t$–$V_{\alpha 2}$) input in the gate of the n-channel transistor Tr28 is higher than the potential of the boot signal input in the gate of the n-channel transistor Tr29, a low-level potential is input in the gate of the n-channel transistor Tr31 from the node ND9. In this case, the n-channel transistor Tr31 enters an OFF-state. If the potential of the boot signal input in the gate of the n-channel transistor Tr29 is higher than the potential (½ Vcc–$V_t$–$V_{\alpha 2}$) input in the gate of the n-channel transistor Tr28, on the other hand, a high-level potential is input in the gate of the n-channel transistor Tr31 from the node ND9. In this case, the n-channel transistor Tr31 enters an ON-state.

If the potential of the boot signal is larger than the potential (½ Vcc–$V_t$–$V_{\alpha 1}$) input in the gate of the n-channel transistor Tr22 and the potential (½ Vcc–$V_t$–$V_{\alpha 2}$) input in the gate of the n-channel transistor Tr28 in the initial state, therefore, the n-channel transistor Tr25 enters an OFF-state and the n-channel transistor Tr31 enters an ON-state. In this case, the DRAM starts supplying the ground potential (GND) to the output line 15 through the ON-state n-channel transistors Tr32 and Tr31, thereby reducing the potential of the boot signal (potential of the output line 15). If the potential of the boot signal is larger than the potential (½ Vcc–$V_t$–$V_{\alpha 1}$) input in the gate of the n-channel transistor Tr22 and smaller than the potential (½ Vcc–$V_t$–$V_{\alpha 2}$) input in the gate of the n-channel transistor Tr28, both of the n-channel transistors Tr25 and Tr31 enter OFF-states. In this case, the output line 15 enters a floating state while holding the current potential of the boot signal. If the potential of the boot signal is smaller than the potential (½ Vcc–$V_t$–$V_{\alpha 1}$) input in the gate of the n-channel transistor Tr22 and the potential (½ Vcc–$V_t$–$V_{\alpha 2}$) input in the gate of the n-channel transistor Tr28, the n-channel transistor Tr25 enters an ON-state and the n-channel transistor Tr31 enters an OFF-state. In this case, the DRAM starts supplying the potential Vcc to the output line 15 through the ON-state n-channel transistor Tr25, thereby increasing the potential of the boot signal (potential of the output line 15). In the initial state, the DRAM controls the potential of the boot signal to be at the intermediate level between the potential (½ Vcc–$V_t$–$V_{\alpha 1}$) input in the gate of the n-channel transistor Tr22 and the potential (½ Vcc–$V_t$–$V_{\alpha 2}$) input in the gate of the n-channel transistor Tr28 in the aforementioned manner.

In the initial state, further, a high-level precharge signal Pri is input in the gates of the n-channel transistors Tr17 and Tr18, as shown in FIG. 12. Thus, the n-channel transistors Tr17 and Tr18 enter ON-states, whereby a signal VBL of the potential ½ Vcc is supplied to the bit line BL and the inverted bit line/BL through the n-channel transistors Tr17 and Tr18 respectively. Therefore, the bit line BL and the inverted bit line/BL are precharged to the potential ½ Vcc. Thereafter the precharge signal Pri goes low to turn off the n-channel transistors Tr17 and Tr18, whereby the bit line BL and the inverted bit line/BL enter floating states at the potential ½ Vcc. Then, the word line decoder 14 selects a word line WL linked with a prescribed memory cell 9 from which data is read. For example, it is assumed that the word line decoder 14 selects a word line WLn linked with a memory cell 9a shown in FIG. 12. In this case, the potential of the selected word line WL rises. Thus, the n-channel transistor Tr16 linked with the word line WLn enters an ON-state, whereby a potential corresponding to the data held in the capacitor 10 of the memory cell 9a appears on the bit line BL through the n-channel transistor Tr16. If the capacitor 10 of the memory cell 9a holds data "H", the potential of the bit line BL is increased by a potential α corresponding to the data "H". Thus, the bit line BL reaches a potential (½ Vcc+α). This potential α may be at a small level of not more than about 40 mV due to leakage or the like. At this time, the inverted bit line/BL is held at the potential ½ Vcc.

At this time, further, a high-level clock signal Φ is input in the gates of the n-channel transistors Tr3 and Tr4 respectively, whereby the n-channel transistors Tr3 and Tr4 are in ON-states. Thus, the potential (½ Vcc+α) of the bit line BL is input in the sense amplifier 2 of the potential comparison circuit 31 as an input potential $V_{in}$ through the n-channel transistor Tr3. Further, the potential (½ Vcc) of the inverted bit line/BL is input in the sense amplifier 2 of the potential comparison circuit 31 as the reference potential $V_{ref1}$ through the n-channel transistor Tr4. Thereafter the clock signal Φ goes low for isolating the bit line BL and the inverted bit line/BL from the nodes ND3 and ND4 respectively.

In a boot period, the boot clock signal Bclk goes low. Following this, the p-channel transistor Tr39 enters an ON-state, whereby a current flows through the p-channel transistor Tr39. Thus, the potential of the boot signal output from the boot signal generation circuit 33 through the output line 15 is gradually increased from the level between the initial potential (½ Vcc–$V_t$–$V_{\alpha 1}$) and the potential (½ Vcc–$V_t$–$V_{\alpha 2}$). Therefore, the potentials of the source/drain regions of the n-channel transistors Tr1 and Tr2 (see FIG. 12) serving as capacitors receiving the boot signal are also gradually increased from the level between the initial potential (½ Vcc–$V_t$–$V_{\alpha 1}$) and the potential (½ Vcc–$V_t$–$V_{\alpha 2}$) respectively. Thereafter the potential comparison circuit 31 enlarges the difference between the potential ($V_{in}$: ½ Vcc+α) of the bit line BL and the potential ($V_{ref1}$: ½ Vcc) of the inverted bit line /BL. The sense amplifier 2 compares the potential ($V_{in\alpha}$) of the bit line BL and the potential ($V_{ref1\alpha}$) of the inverted bit line/BL after the enlargement of the potential difference with each other thereby further enlarging (amplifying) the difference between the potential ($V_{in\alpha}$) of the bit line BL and the potential ($V_{ref1\alpha}$) of the inverted bit line/BL while determining whether the potential ($V_{in\alpha}$) of the bit line BL is higher or lower than the potential ($V_{ref1}$) of the inverted bit line /BL. At this time, the potential comparison circuit 31 operates similarly to the potential comparison circuit 1 according to the aforementioned first embodiment shown in FIG. 1. If the potential ($V_{in}$) of the bit line BL is higher than the potential ($V_{ref1}$) of the inverted bit line /BL, the DRAM increases the potential ($V_{in}$) of the bit line BL to the level Vcc and reduces the potential ($V_{ref1}$) of the inverted bit line/BL to the ground potential (GND), as shown in FIG. 14. If the potential ($V_{in}$) of the bit line BL is lower than the potential ($V_{ref1}$) of the inverted bit line/BL, on the other hand, the DRAM reduces the potential ($V_{in}$) of the bit line BL to the ground potential (GND) and increases the potential ($V_{ref1}$) of the inverted bit line/BL to the level Vcc, as shown in FIG. 15.

In the DRAM according to the fourth embodiment, the potential of the clock signal Φ goes high after the aforementioned data read operation, for rewriting the data in the memory cell 9a (see FIG. 12) from which the data has been read. In other words, the potential of the clock signal Φ input in the gates of the n-channel transistors Tr3 and Tr4 goes high after sensing, thereby turning on the n-channel transistors Tr3 and Tr4. Thus, if the potential ($V_{in}$) corresponding to the data of the memory cell 9a read on the bit line BL has been higher than the potential ($V_{ref1}$) of the inverted bit line/BL (the case of the data "H"), the potential increased to the level Vcc by the sense amplifier 2 is transmitted to the bit line BL through the n-channel transistor Tr3, while the potential reduced to the ground potential (GND) by the sense amplifier 2 is transmitted to the inverted bit line/BL through the n-channel transistor Tr4. Thus, the potential (Vcc) of the bit line BL is transmitted to the capacitor 10 of the memory cell 9a through the ON-state n-channel transistor Tr16 linked with the selected word line WLn, thereby rewriting the data "H". If the potential ($V_{in}$) corresponding to the data of the memory cell 9a read on the bit line BL has been lower than the potential ($V_{ref1}$) of the inverted bit line/BL (the case of data "L"), on the other hand, the potential reduced to the ground level (GND) by the sense amplifier 2 is transmitted to the bit line BL through the n-channel transistor Tr3, while the potential increased to the level Vcc by the sense amplifier 2 is transmitted to the inverted bit line/BL through the n-channel transistor Tr4. Thus, the potential (ground potential (GND)) of the bit line BL is transmitted to the capacitor 10 of the memory cell 9a through the ON-state n-channel transistor Tr16 linked with the selected word line WLn, thereby rewriting the data "L".

According to the fourth embodiment, as hereinabove described, the DRAM inputs the input potential $V_{in}$ responsive to the data held in the capacitor 10 of the memory cell 9 in the gate of the n-channel transistor Tr1 through the bit line BL while inputting the reference potential $V_{ref1}$ in the gate of the n-channel transistor Tr2 through the inverted bit line/BL in data reading. The DRAM increases the potentials of the pairs of the source/drain regions of the n-channel transistors Tr1 and Tr2 serving as capacitors from the prescribed level between the potential ($V_{ref1}-V_t-V_{\alpha 1}$) and the potential ($V_{ref1}-V_t-V_{\alpha 2}$) to the level Vcc, thereby enlarging the difference between the input potential $V_{in}$ responsive to the data held in the capacitor 10 of the memory cell 9 input in the gate of the n-channel transistor Tr1 and the reference potential $V_{ref1}$ input in the gate of the n-channel transistor Tr2. Thereafter the sense amplifier 2 compares the potential $V_{in\alpha}$ increased from the input potential $V_{in}$ responsive to the data held in the capacitor 10 of the memory cell 9 and the potential $V_{ref1\alpha}$ increased from the reference potential $V_{ref1}$ with each other, thereby determining whether the input potential $V_{in}$ is larger or smaller than the reference potential $V_{ref1}$. Thus, the sense amplifier 2 can more reliably determine whether the input potential $V_{in}$ is higher or lower than the reference potential $V_{ref1}$ as compared with a case of comparing the input potential $V_{in}$ and the reference potential $V_{ref1}$ with each other through the sense amplifier 2 without enlarging the potential difference. Therefore, the DRAM can improve the accuracy for determining whether the input potential $V_{in}$ responsive to the data held in the capacitor 10 of the memory cell 9 is higher or lower than the reference potential $V_{ref1}$. Also when the difference between the input potential $V_{in}$ responsive to the data held in the capacitor 10 of the memory cell 9 input in the gate of the n-channel transistor Tr1 and the reference potential $V_{ref1}$ input in the gate of the n-channel transistor Tr2 is smaller than the sensitivity of the sense amplifier 2, the sense amplifier 2 receiving the input potential $V_{in\alpha}$ and the reference potential $V_{ref1\alpha}$ after the enlargement of the potential difference can easily determine whether the input potential $V_{in}$ responsive to the data held in the capacitor 10 of the memory cell 9 is higher or lower than the reference potential $V_{ref1}$.

The remaining effects of the fourth embodiment are similar to those of the aforementioned first embodiment.

Fifth Embodiment

A potential comparison circuit according to a fifth embodiment of the present invention is applied to a 1T1C ferroelectric memory. The structure of the 1T1C ferroelectric memory according to the fifth embodiment is now described with reference to FIGS. 16 and 17.

Figure 16:
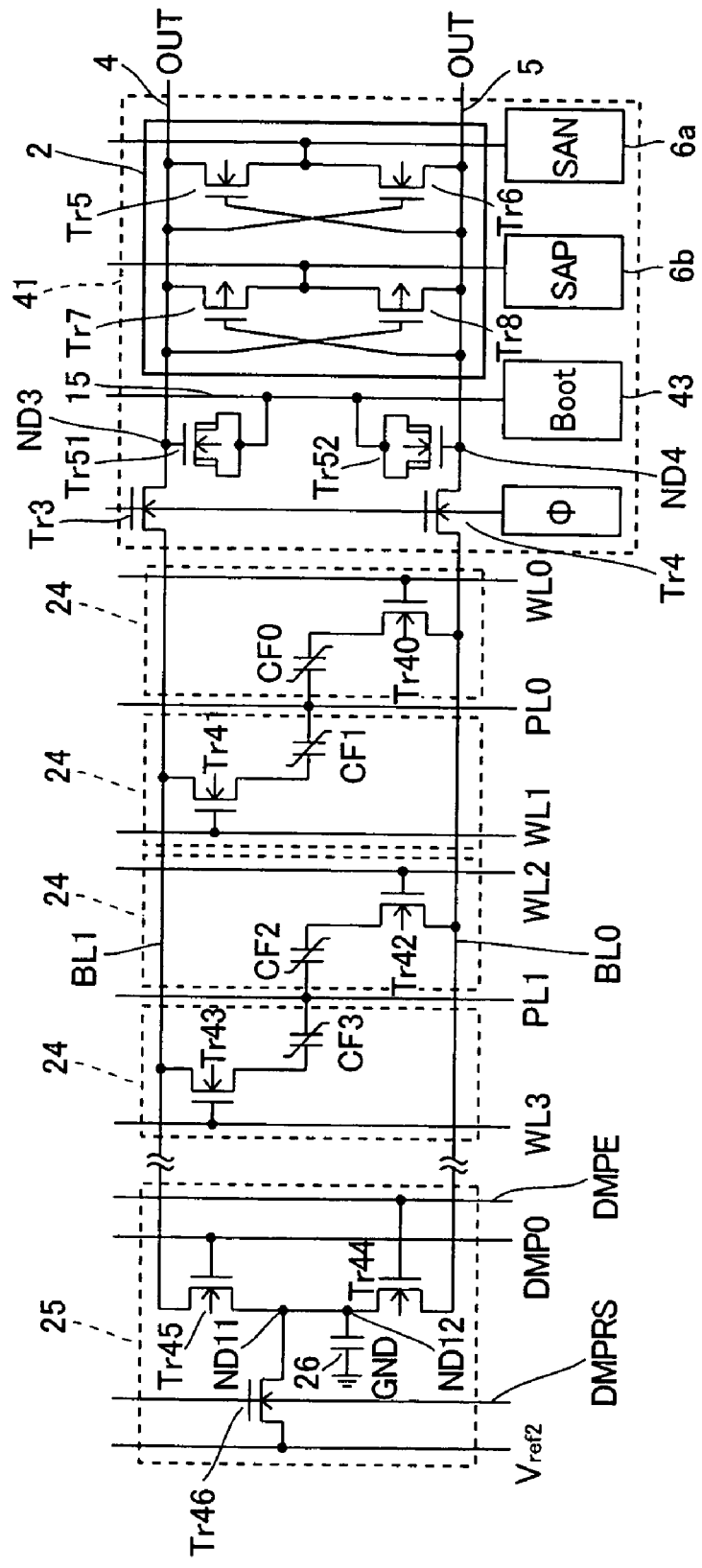
FIG. 16 is a circuit diagram showing the structure of a 1T1C ferroelectric memory according to a fifth embodiment of the present invention.

The 1T1C ferroelectric memory according to the fifth embodiment is so structured as to compare the potential of a bit line corresponding to data held in a ferroelectric capacitor of a memory cell and a reference potential with each other through the potential comparison circuit thereby determining whether the potential of the bit line is higher or lower than the reference potential in data reading. More specifically, the 1T1C ferroelectric memory according to the fifth embodiment comprises a plurality of memory cells 24, a reference voltage generation circuit 25 and a potential comparison circuit 41, as shown in FIG. 16. The plurality of memory cells 24 are provided along a bit line pair BL0/BL1 consisting of bit lines BL0 and BL1. The bit lines BL0 and BL1 are examples of the "data line" in the present invention. A plurality of word lines WL0 to WL3 and a plurality of plate lines PL0 and PL1 are provided to extend perpendicularly to the bit line pair BL0/BL1. The plate lines PL0 and PL1 are examples of the "driving line" in the present invention. The memory cells 24 are formed by single ferroelectric capacitors CF0 to CF3 holding data and single n-channel transistors Tr40 to Tr43 respectively. The ferroelectric capacitors CF0 to CF3 are examples of the "storage means" in the present invention. The ferroelectric capacitors CF0 to CF3 are constituted of first electrodes, second electrodes and ferroelectric films held between the first and second electrodes respectively. The first electrode of the ferroelectric capacitor CF0 (CF2) is connected to the plate line PL0 (PL1), while the second electrode thereof is connected to either the source region or the drain region of the n-channel transistor Tr40 (Tr42). Either the drain region or the source region of the n-channel transistor Tr40 (Tr42) is connected to the bit line BL0. The gate of the n-channel transistor Tr40 (Tr42) is connected to the word line WL0 (WL2). The first electrode of the ferroelectric capacitor CF1 (CF3) is connected to the plate line PL0 (PL1), while the second electrode thereof is connected to either the source region or the drain region of the n-channel transistor Tr4 (Tr43). Either the drain region or the source region of the n-channel transistor Tr41 (Tr43) is connected to the bit line BL1. The gate of the n-channel transistor Tr41 (Tr43) is connected to the word line WL1 (WL3).

The reference voltage generation circuit 25 is provided every bit line pair BL0/BL1. This reference voltage generation circuit 25 is provided for supplying a reference potential $V_{ref2}$ to the potential comparison circuit 41 through the bit line BL0 or BL1 as a reference voltage for determining data. The reference voltage circuit 25 is formed by three n-channel transistors Tr44 to Tr46 and one capacitor 26. Either the source region or the drain region of the n-channel transistor Tr44 is connected with either the source region or the drain region of the n-channel transistor Tr45. Either the drain region or the source region of the n-channel transistor Tr44 is connected to the bit line BL0, while either the drain region or the source region of the n-channel transistor Tr45 is connected to the bit line BL1. Control signals DMP0 and DMPE are input in the gates of the n-channel transistors Tr44 and Tr45 for ON-OFF controlling the n-channel transistors Tr44 and Tr45 respectively. Either the source region or the drain region of the n-channel transistor Tr46 is connected to a node ND11 between either the source regions or the drain regions of the n-channel transistors Tr44 and Tr45. Either the drain region or the source region of the n-channel transistor Tr46 is supplied with the reference potential $V_{ref2}$. A control signal DMPRS is input in the gate of the n-channel transistor Tr46 for ON-OFF controlling the n-channel transistor Tr46. The first electrode of the capacitor 26 is connected to a node ND12 between either the source regions or the drain regions of the n-channel transistors Tr44 and Tr45. The second electrode of the capacitor 26 is grounded.

Figure 17:
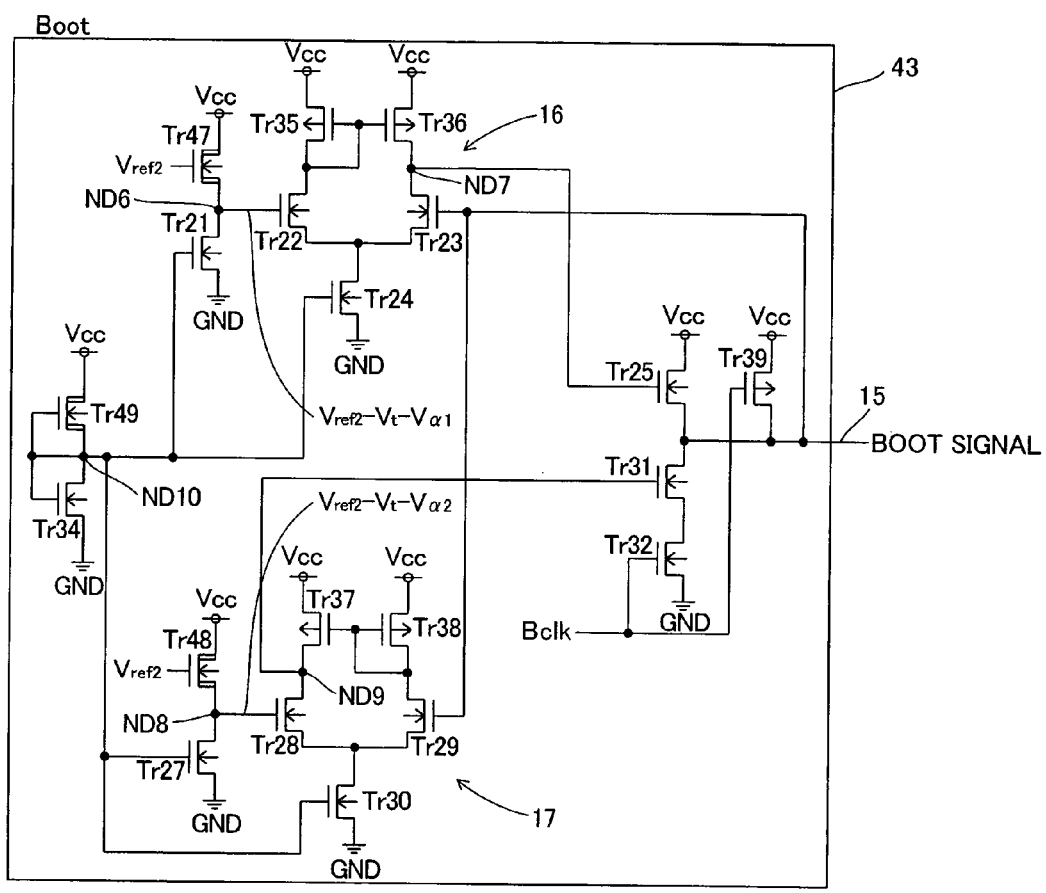
FIG. 17 is a circuit diagram showing the structure of a boot signal generation circuit of the 1T1C ferroelectric memory according to the fifth embodiment shown in FIG. 16.

The potential comparison circuit 41 is also provided every bit line pair BL0/BL1. This potential comparison circuit 41 is similar in structure to the potential comparison circuit 31 according to the aforementioned fourth embodiment shown in FIG. 12 except depression type n-channel transistors Tr51 and Tr52 and the circuit structure of a boot signal generation circuit 43. In the boot signal generation circuit 43 of the potential comparison circuit 41, depression type n-channel transistors Tr47, Tr48 and Tr49 substitute for the enhancement type n-channel transistors Tr20, Tr26 and Tr33 of the boot signal generation circuit 33 according to the aforementioned fourth embodiment shown in FIG. 13 respectively, as shown in FIG. 17. The reference potential $V_{ref2}$ is input in the gates of the n-channel transistors Tr47 and Tr48. The gates of the n-channel transistors Tr49 and Tr34 are connected to a node ND10 between either the source regions or the drain regions of the n-channel transistors Tr49 and Tr34. The remaining structure of the boot signal generation circuit 43 according to the fifth embodiment is similar to that of the boot signal generation circuit 33 according to the aforementioned fourth embodiment shown in FIG. 13.

Figure 18:
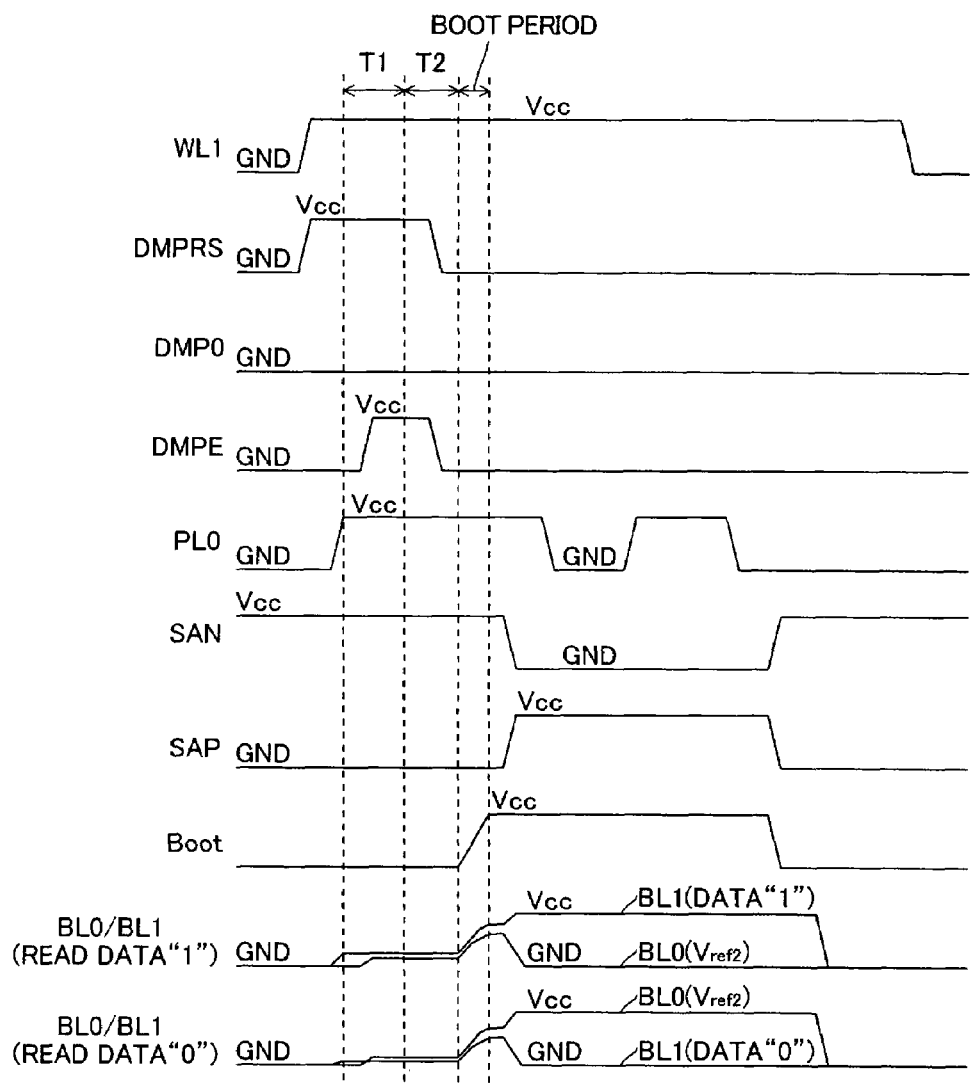
FIG. 18 is a voltage waveform diagram for illustrating operations of the 1T1C ferroelectric memory according to the fifth embodiment of the present invention.
Figure 19:
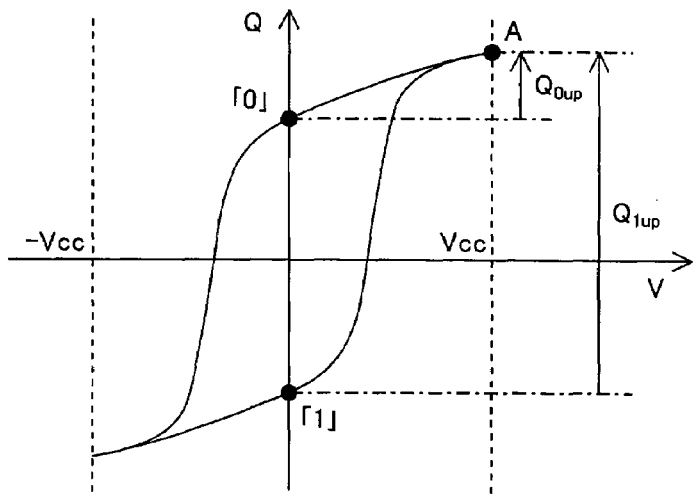
FIG. 19 is a hysteresis diagram showing the polarization state of a ferroelectric capacitor of the 1T1C ferroelectric memory according to the fifth embodiment of the present invention.

FIG. 18 is a waveform diagram for illustrating operations of the 1T1C ferroelectric memory according to the fifth embodiment of the present invention. FIG. 19 is a hysteresis diagram showing the polarization state of a ferroelectric capacitor CF1 of the 1T1C ferroelectric memory according to the fifth embodiment. The operations of the 1T1C ferroelectric memory according to the fifth embodiment of the present invention are now described with reference to FIGS. 16 to 19.

In an initial state of data reading, the boot signal generation circuit 43 (see FIG. 17) according to the fifth embodiment outputs a boot signal controlled to a potential between the potential ($V_{ref2}-V_t-V_{\alpha 1}$) of the node ND6 input in the gate of the n-channel transistor Tr22 and the potential ($V_{ref2}-V_t-V_{\alpha 2}$) of the node ND8 input in the gate of the n-channel transistor Tr25 through an operation similar to that of the boot signal generation circuit 33 according to the aforementioned fourth embodiment shown in FIG. 13. In the initial state, the word line WL1, the plate line PL0 and the bit lines BL0 and BL1 are held at the ground potential (GND), as shown in FIG. 18. The control signals DMPRS, DMP0 and DMPE and a sense amplifier activation signal SAP are also held at the ground potential (GND). Another sense amplifier activation signal SAN is held at the potential Vcc. In this state, the word line WL1 rises from the ground potential (GND) to the potential Vcc. Thus, the n-channel transistor Tr41 linked with the word line WL1 enters an ON-state. Further, the control signal DMPRS also rises from the ground potential (GND) to the potential Vcc. Thus, the n-channel transistor Tr46 of the reference voltage generation circuit 25 enters an ON-state. Therefore, the reference potential $V_{ref2}$ is supplied through the ON-state n-channel transistor Tr46, whereby the nodes ND11 and ND12 reach the reference potential $V_{ref2}$ and the capacitor 26 is charged with the reference potential $V_{ref2}$.

In a period T1 shown in FIG. 18, the 1T1C ferroelectric memory applies a voltage pulse to the ferroelectric capacitor CF1 through the plate line PL0 so that the potential of the ferroelectric capacitor CF1 rises to the level Vcc. More specifically, the plate line PL0 rises from the ground potential (GND) to the potential Vcc. Thus, the 1T1C ferroelectric memory applies the voltage Vcc to the ferroelectric capacitor CF1 through the plate line PL0. Therefore, a potential responsive to the data held in the ferroelectric capacitor CF1 is generated on the bit line BL1. At this time, the polarization state of the ferroelectric capacitor CF1 shifts from "0" to a point A along a hysteresis curve as shown in FIG. 19, if the ferroelectric capacitor CF1 holds data "0". Thus, the total charge quantity of the bit line BL1 linked with the ferroelectric capacitor CF1 is increased by a quantity $Q_{0up}$ shown in FIG. 19. Therefore, the potential of the bit line BL1 is increased in correspondence to the charge quantity $Q_{0up}$. If the ferroelectric capacitor CF1 holds data "1", on the other hand, the polarization state of the ferroelectric capacitor CF1 shifts from "1" to the point A along the hysteresis curve. Thus, the total charge quantity of the bit line BL1 linked with the ferroelectric capacitor CF1 is increased by a quantity $Q_{1up}$ shown in FIG. 19. Therefore, the potential of the bit line BL1 is increased in correspondence to the charge quantity $Q_{1up}$. As understood from the hysteresis diagram shown in FIG. 19, the increment $Q_{1up}$ of the total charge quantity of the bit line BL1 linked with the ferroelectric capacitor CF1 holding the data "1" is larger than the increment $Q_{0up}$ of the total charge quantity of the bit line BL1 linked with the ferroelectric capacitor CF1 holding the data "0". Thus, the potential of the bit line BL1 linked with the ferroelectric capacitor CF1 holding the data "1" is higher than the potential of the bit line BL1 linked with the ferroelectric capacitor CF1 holding the data "0".

Then, the control signal DMPE rises from the ground potential (GND) to the potential Vcc. Thus, the n-channel transistor Tr44 of the reference voltage generation circuit 25 enters an ON-state. Therefore, the reference potential $V_{ref2}$ is supplied to the bit line BL0 through the ON-state n-channel transistor Tr44. Thus, the bit line BL0 reaches the reference potential $V_{ref2}$. Then, the control signal DMPRS falls from the potential Vcc to the ground potential (GND) in a period T2 shown in FIG. 18. Thus, the n-channel transistor Tr46 of the reference voltage generation circuit 25 enters an OFF-state.

Further, the control signal DMPE also falls from the potential Vcc to the ground potential (GND). Thus, the n-channel transistor Tr44 of the reference voltage generation circuit 25 enters an OFF-state. Therefore, the bit line BL0 enters a floating state while holding the reference potential $V_{ref2}$.

At this time, the 1T1C ferroelectric memory inputs a high-level clock signal Φ in the gates of the n-channel transistors Tr3 and Tr4, which in turn enter ON-states. Therefore, the potential of the bit line BL1 is input in the sense amplifier 2 of the potential comparison circuit 41 through the n-channel transistor Tr3 as an input potential $V_{in}$. Further, the potential (reference potential $V_{ref2}$) of the bit line BL0 is input in the sense amplifier 2 of the potential comparison circuit 41 through the n-channel transistor Tr4.

Then, the boot clock signal Bclk goes low in a boot period. Following this, the p-channel transistor Tr39 of the boot signal generation circuit 43 (see FIG. 17) enters an ON-state, whereby a current flows through the p-channel transistor Tr39. Thus, the potential of the boot signal output from the boot signal generation circuit 43 through the output line 15 is gradually increased from a level between the initial potential ($V_{ref2}-V_t-V_{\alpha 1}$) and the potential ($V_{ref2}-V_t-V_{\alpha 2}$). Therefore, the potentials of the source/drain regions of the n-channel transistors Tr51 and Tr52 (see FIG. 16) serving as capacitors receiving the boot signal are also gradually increased from the level between the initial potential ($V_{ref2}-V_t-V_{\alpha 1}$) and the potential ($V_{ref2}-V_t-V_{\alpha 2}$) respectively. Thereafter the potential comparison circuit 41 enlarges the difference between the potential ($V_{in}$) of the bit line BL1 and the potential ($V_{ref2}$) of the bit line BL0. The sense amplifier 2 compares the potential ($V_{in\alpha}$) of the bit line BL1 and the potential ($V_{ref2\alpha}$) of the bit line BL0 after the enlargement of the potential difference with each other thereby further enlarging (amplifying) the difference between the potential ($V_{in\alpha}$) of the bit line BL1 and the potential ($V_{ref2\alpha}$) of the bit line BL0 while determining whether the potential ($V_{in}$) of the bit line BL is higher or lower than the potential ($V_{ref2}$) of the bit line BL0. At this time, the potential comparison circuit 41 and the sense amplifier 2 operate similarly to the potential comparison circuit 1 and the sense amplifier 2 according to the aforementioned first embodiment shown in FIG. 1. If the potential ($V_{in}$) of the bit line BL1 is higher than the potential ($V_{ref2}$) of the bit line BL0, the 1T1C ferroelectric memory increases the potential ($V_{in}$) of the bit line BL1 to the level Vcc and reduces the potential ($V_{ref2}$) of the bit line BL0 to the ground potential (GND), as shown in FIG. 18. If the potential ($V_{in}$) of the bit line BL1 is lower than the potential ($V_{ref2}$) of the bit line BL0, on the other hand, the 1T1C ferroelectric memory reduces the potential ($V_{in}$) of the bit line BL1 to the ground potential (GND) and increases the potential ($V_{ref2}$) of the bit line BL0 to the level Vcc.

According to the fifth embodiment, as hereinabove described, the 1T1C ferroelectric memory inputs the input potential $V_{in}$ responsive to the data held in the ferroelectric capacitor CF1 in the gate of the n-channel transistor Tr51 through the bit line BL1 while inputting the reference potential $V_{ref2}$ in the gate of the n-channel transistor Tr52 through the bit line BL0 in data reading. The 1T1C ferroelectric memory enlarges the difference between the input potential $V_{in}$ responsive to the data held in the ferroelectric capacitor CF1 input in the gate of the n-channel transistor Tr51 and the reference potential $V_{ref2}$ input in the gate of the n-channel transistor Tr52 by increasing the potentials of the pairs of source/drain regions of the n-channel transistors Tr51 and Tr52 serving as capacitors from the level between the initial potential ($V_{ref2}-V_t-V_{\alpha 1}$) and the potential ($V_{ref2}-V_t-V_{\alpha 2}$). Thereafter the sense amplifier 2 compares the potential $V_{in\alpha}$ increased from the input potential $V_{in}$ responsive to the data held in the ferroelectric capacitor CF1 and the potential $V_{ref2\alpha}$ increased from the reference potential $V_{ref2}$ with each other, thereby determining whether the input potential $V_{in}$ is larger or smaller than the reference potential $V_{ref2}$. Thus, the sense amplifier 2 can more reliably determine whether the input potential $V_{in}$ is higher or lower than the reference potential $V_{ref2}$ as compared with a case of comparing the input potential $V_{in}$ and the reference potential $V_{ref2}$ with each other through the sense amplifier 2 without enlarging the potential difference. Therefore, the 1T1C ferroelectric memory can improve the accuracy for determining whether the input potential $V_{in}$ responsive to the data held in the ferroelectric capacitor CF1 is higher or lower than the reference potential $V_{ref2}$. Also when the difference between the input potential $V_{in}$ responsive to the data held in the ferroelectric capacitor CF1 input in the gate of the n-channel transistor Tr51 and the reference potential $V_{ref2}$ input in the gate of the n-channel transistor Tr52 is smaller than the sensitivity of the sense amplifier 2, the sense amplifier 2 receiving the input potential $V_{in\alpha}$ and the reference potential $V_{ref2\alpha}$ after the enlargement of the potential difference can easily determine whether the input potential $V_{in}$ responsive to the data held in the ferroelectric capacitor CF1 is higher or lower than the reference potential $V_{ref2}$.

According to the fifth embodiment, the 1T1C ferroelectric memory can boot the input potential $V_{in}$ and the reference potential $V_{ref2}$ by increasing a prescribed positive potential of the boot signal in the initial state without using a negative potential for the boot signal when preparing the n-channel transistors Tr51 and Tr52 for booting the input potential $V_{in}$ and the reference potential $V_{ref2}$ respectively from depression type n-channel transistors, also when the input potential $V_{in}$ and the reference potential $V_{ref2}$ have low initial levels.

The remaining effects of the fifth embodiment are similar to those of the aforementioned first embodiment.

Sixth Embodiment

Figure 20:
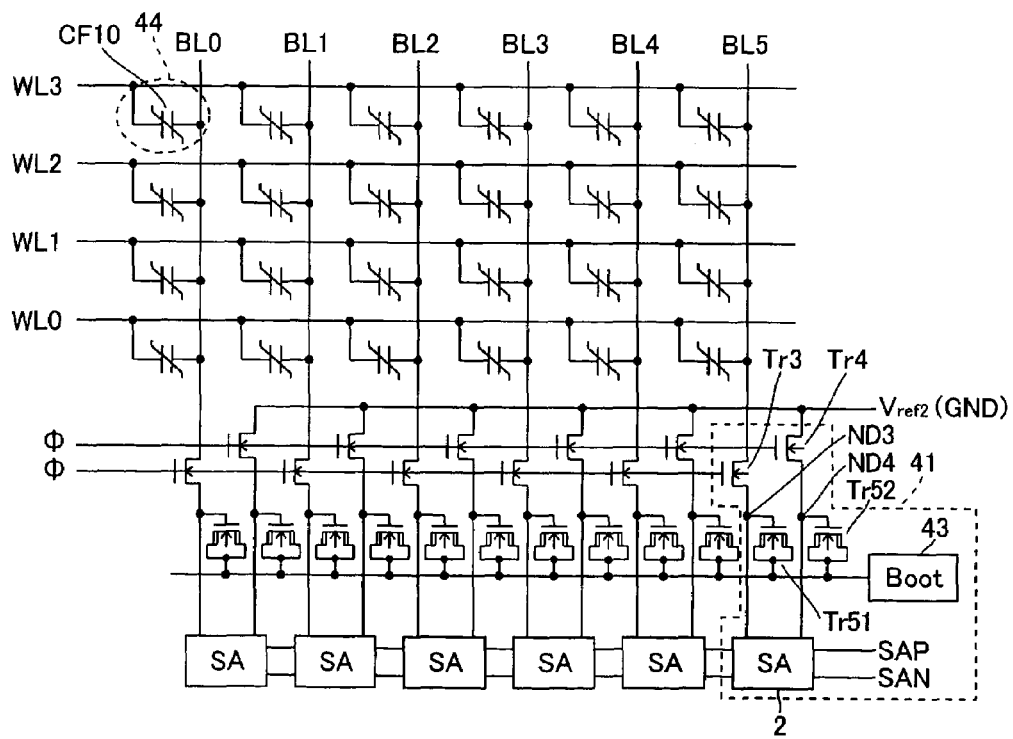
FIG. 20 is a circuit diagram showing the structure of a cross-point ferroelectric memory according to a sixth embodiment of the present invention.

Referring to FIG. 20, a potential comparison circuit according to a sixth embodiment of the present invention is applied to a cross-point ferroelectric memory.

In the cross-point ferroelectric memory according to the sixth embodiment, word lines WL0 to WL3 and bit lines BL0 to BL5 are arranged to extend perpendicularly to each other, as shown in FIG. 20. The word lines WL0 to WL3 are examples of the "driving line" in the present invention, and the bit lines BL0 to BL5 are examples of the "data line" in the present invention. Memory cells 44 formed by only single ferroelectric capacitors CF10 are provided on the positions of intersection between the word lines WL0 to WL3 and the bit lines BL0 to BL5 respectively. The ferroelectric capacitors CF10 are examples of the "storage means" in the present invention. First ends of the bit lines BL0 to BL5 are connected to either the source regions or the drain regions of n-channel transistors Tr3 of potential comparison circuits 41 provided for the bit lines BL0 to BL5 respectively. The structure of each potential comparison circuit 41 connected with each of the bit lines BL0 to BL5 is similar to that of the potential comparison circuit 41 according to the aforementioned fifth embodiment shown in FIG. 16. In a boot signal generation circuit 43 according to the sixth embodiment, however, a reference potential $V_{ref2}$ of the ground level (GND) is input in the gates of n-channel transistors Tr47 and Tr48 identical to those of the boot signal generation circuit 43 according to the fifth embodiment shown in FIG. 17. The circuit structure of a sense amplifier 2, not shown in FIG. 20 for simplifying the illustration, is similar to that of the sense amplifier 2 according to the fifth embodiment shown in FIG. 16.

Figure 21:
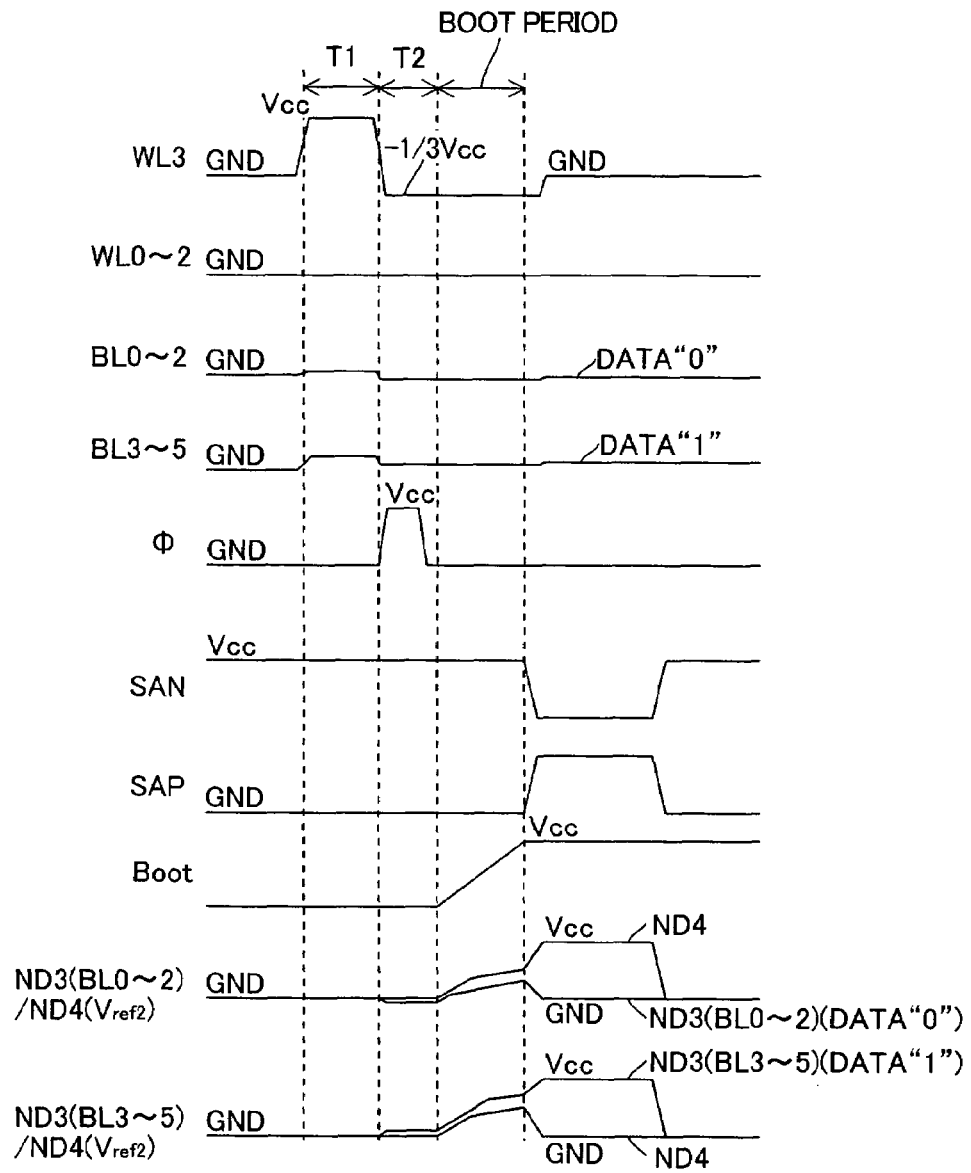
FIG. 21 is a voltage waveform diagram for illustrating operations of the cross-point ferroelectric memory according to the sixth embodiment of the present invention.
Figure 22:
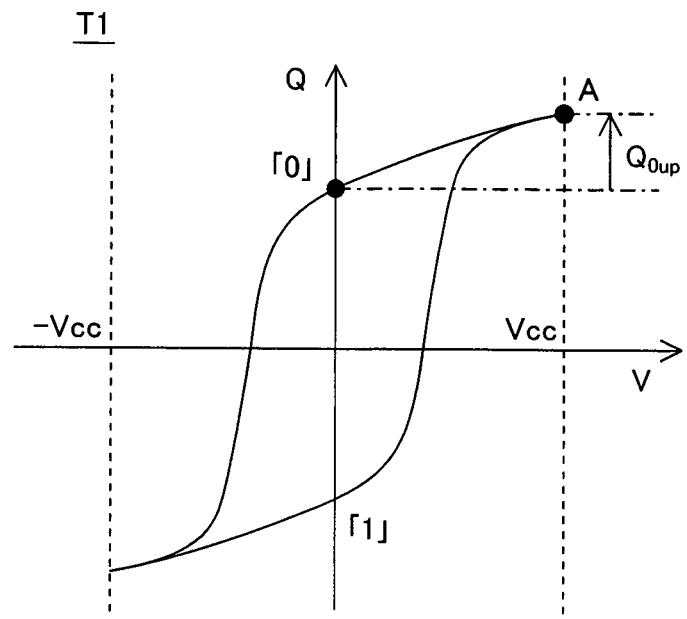
FIGS. 22 to 24 are hysteresis diagrams showing the polarization states of a ferroelectric capacitor of the cross-point ferroelectric memory according to the sixth embodiment of the present invention.
Figure 23:
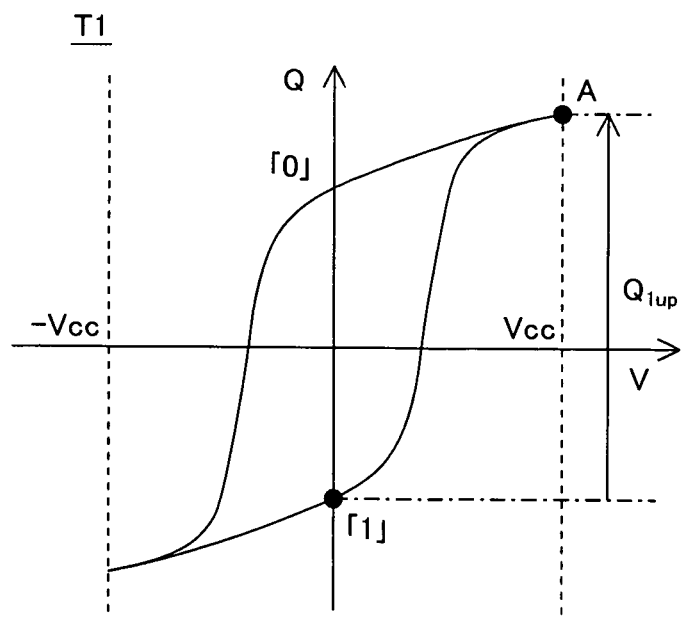
Figure 24:
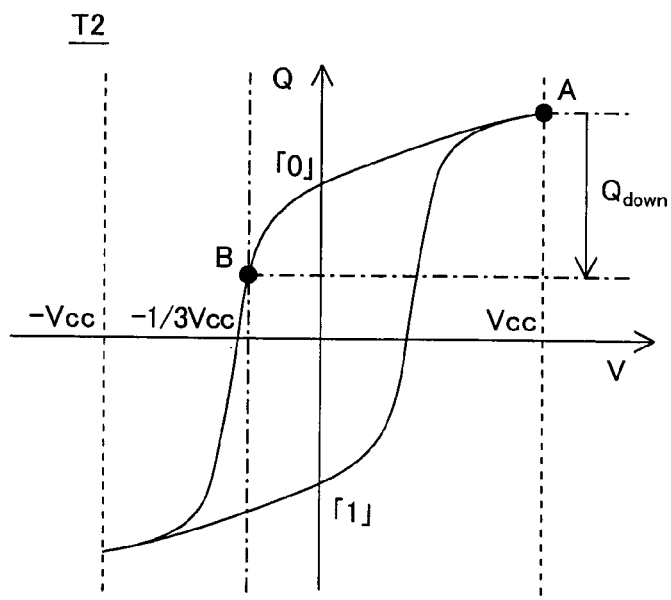

FIG. 21 is a waveform diagram for illustrating operations of the cross-point ferroelectric memory according to the sixth embodiment of the present invention. FIGS. 22 to 24 are hysteresis diagrams showing polarization states of the ferroelectric capacitors CF10 of the cross-point ferroelectric memory according to the sixth embodiment of the present invention. The operations of the cross-point ferroelectric memory according to the sixth embodiment of the present invention are now described with reference to FIGS. 20 to 24. In the following description, it is assumed that the cross-point ferroelectric memory collectively reads data from all memory cells 34 linked with the word line WL3. It is also assumed that the ferroelectric capacitors CF10 linked with the word line WL3 and the bit lines BL0 to BL2 hold data "0" while the ferroelectric capacitors CF10 linked with the word line WL3 and the bit lines BL3 to BL5 hold data "1".

In an initial state of data reading, the boot signal generation circuit 43 (see FIG. 20) according to the sixth embodiment outputs a boot signal controlled to a potential between the potential ($V_{ref2}-V_t-V_{\alpha 1}$) of a node ND6 input in the gate of an n-channel transistor Tr22 similar to that shown in FIG. 17 and the potential ($V_{ref2}-V_t-V_{\alpha 2}$) of a node ND8 input in the gate of an n-channel transistor Tr25 similar to that shown in FIG. 17 through an operation similar to that of the boot signal generation circuit 43 according to the aforementioned fifth embodiment shown in FIG. 17. At this time, the ground potential (GND: 0 V) is input as the reference potential $V_{ref2}$, whereby the potential of the boot signal is controlled to a level between potentials ($-V_t-V_{\alpha 1}$) and ($-V_t-V_{\alpha 2}$). This boot signal has a positive potential due to negative voltages Vt of the depression type n-channel transistors Tr47 and Tr48. In the initial state, the word lines WL0 to WL3 and the bit lines BL0 to BL5 are held at the ground potential (GND), as shown in FIG. 21. A clock signal Φ and a sense amplifier activation signal SAP are also held at the ground potential (GND), while another sense amplifier activation signal SAN is held at a power supply potential (Vcc). The cross-point ferroelectric memory brings the bit lines BL0 to BL5 into floating states, and thereafter selects the word line WL3 and applies a voltage pulse to all ferroelectric capacitors CF10 linked with the word line WL3 to rise to the potential Vcc in a period T1 shown in FIG. 21.

More specifically, the word line WL3 rises from the ground potential (GND) to the potential Vcc. Thus, the cross-point ferroelectric memory applies the voltage Vcc to all ferroelectric capacitors CF10 linked with the word line WL3. At this time, the polarization state shifts from "0" to a point A along a hysteresis curve in each of the ferroelectric capacitors CF10 linked with the word line WL3 and the bit lines BL0 to BL2, as shown in FIG. 22. Thus, the total charge quantity of the bit lines BL0 to BL2 is increased by a quantity $Q_{0up}$ shown in FIG. 22. Therefore, the potentials of the bit lines BL0 to BL2 are increased in correspondence to the charge quantity $Q_{0up}$. In each of the ferroelectric capacitors CF10 linked with the word line WL3 and the bit lines BL3 to BL5, on the other hand, the polarization state shifts from "1" to a point A along a hysteresis curve, as shown in FIG. 23. Thus, the total charge quantity of the bit lines BL3 to BL5 is increased by a quantity $Q_{1up}$ shown in FIG. 23. Therefore, the potentials of the bit lines BL3 to BL5 are increased in correspondence to the charge quantity $Q_{1up}$.

In a period T2 shown in FIG. 21, the word line WL3 falls from the potential Vcc to a potential $-\frac{1}{3}$ Vcc. Thus, the cross-point ferroelectric memory applies the voltage $-\frac{1}{3}$ Vcc to all ferroelectric capacitors CF10 linked with the word line WL3. At this time, the polarization state shifts from the point A to a point B along the hysteresis curve in each of the ferroelectric capacitors CF10 linked with the word line WL3 and the bit lines BL0 to BL5, as shown in FIG. 24. Thus, the total charge quantity of the bit lines BL0 to BL5 is reduced by a quantity $Q_{down}$ shown in FIG. 24. Therefore, the potentials of the bit lines BL0 to BL5 are reduced in correspondence to the charge quantity $Q_{down}$.

The total charge quantity of the bit lines BL0 to BL2 changes by a quantity ($Q_{0up}-Q_{down}$) in the periods T1 and T2 shown in FIG. 21. The quantity $Q_{0up}$ is less than the quantity $Q_{down}$ ($Q_{0up}<Q_{down}$) as understood the shapes of the hysteresis curves shown in FIGS. 22 and 24, whereby the quantity ($Q_{0up}-Q_{down}$) has a negative value. Therefore, the potentials of the bit lines BL0 to BL2, which have been at the ground level (GND) in the initial state, reach negative levels in the period T2. On the other hand, the total charge quantity of the bit lines BL3 to BL5 changes by a quantity ($Q_{1up}-Q_{down}$) in the periods T1 and T2. The quantity $Q_{1up}$ is greater than the quantity $Q_{down}$ ($Q_{1up}>Q_{down}$) as understood the shapes of the hysteresis curves shown in FIGS. 23 and 24, whereby the quantity ($Q_{1up}-Q_{down}$) has a positive value. Therefore, the potentials of the bit lines BL3 to BL5, which have been at the ground level (GND) in the initial state, reach positive levels in the period T2.

In the period T2 shown in FIG. 21, the clock signal Φ rises from the ground potential (GND) to the potential Vcc. Thus, n-channel transistors Tr3 and Tr4 enter ON-states. Therefore, the potentials of the bit lines BL0 to BL5 are input in the sense amplifiers 2 of the potential comparison circuits 41 through the ON-state n-channel transistors Tr3 respectively as input potentials $V_{in}$. Thus, negative potentials are input in the sense amplifiers 2 linked with the bit lines BL0 to BL2, while positive potentials are input in the sense amplifiers 2 linked with the bit lines BL3 to BL5. Further, the reference potential $V_{ref2}$ of the ground level (GND) is supplied to the sense amplifiers 2 through the ON-state n-channel transistors Tr4. Thereafter the clock signal Φ falls to the ground potential (GND). Thus, the n-channel transistors Tr3 and Tr4 enter OFF-states. Therefore, nodes ND3 enter floating states while holding the input potentials $V_{in}$, while nodes ND4 enter floating states while holding the reference potential $V_{ref2}$ of the ground level (GND).

In a boot period shown in FIG. 21, a boot clock signal Bclk goes low. Following this, a p-channel transistor Tr39 of the boot signal generation circuit 43 (see FIG. 17) enters an ON-state, whereby a current flows through the p-channel transistor Tr39. Thus, the potential of the boot signal output from the boot signal generation circuit 43 through an output line 15 is gradually increased from the level between the initial potential ($-V_t-V_{\alpha 1}$) and the potential ($-V_t-V_{\alpha 2}$). Therefore, the potentials of the source/drain regions of n-channel transistors Tr51 and Tr52 (see FIG. 20) serving as capacitors receiving the boot signal are also increased from the level between the initial potential ($-V_t-V_{\alpha 1}$) and the potential ($-V_t-V_{\alpha 2}$) respectively. Thereafter the potential comparison circuits 41 amplify the difference between the potentials ($V_{in}$) of the bit lines BL0 to BL5 and the reference potential $V_{ref2}$ of the ground level (GND) similarly to the operation in the boot period according to the aforementioned fifth embodiment. The sense amplifiers 2 compare the potentials ($V_{in\alpha}$) of the bit lines BL0 to BL5 and the reference potential ($V_{ref2\alpha}$) after the enlargement of the potential difference respectively, thereby further enlarging (amplifying) the difference between the potentials ($V_{in}$) of the bit lines BL0 to BL5 and the reference potential $V_{ref2}$ of the ground level (GND). The sense amplifiers 2 further determine whether the potentials ($V_{in}$) of the bit lines BL0 to BL5 are higher or lower than the reference potential $V_{ref2}$ of the ground level (GND).

According to the sixth embodiment, as hereinabove described, the cross-point ferroelectric memory can set the reference potential $V_{ref2}$ for determining data "0" or "1" not yet increased through the boot signal to the ground level (GND) by applying voltage pulses to the ferroelectric capacitors CF10 through the word line WL3 to generate negative potentials on the bit lines BL0 to BL2 linked with the ferroelectric capacitors CF10 holding the data "0" while generating positive potentials on the bit lines BL3 to BL5 linked with the ferroelectric capacitors CF10 holding the data "1" and thereafter collectively reading the data from the ferroelectric capacitors CF10 linked with the word line WL3. Thus, the cross-point ferroelectric memory can easily set the reference potential $V_{ref2}$ also when the potentials generated on the bit lines BL0 to BL5 are dispersed in data reading.

According to the sixth embodiment, further, the cross-point ferroelectric memory can set the reference potential $V_{ref2}$ for determining data "0" or "1" to the ground level (GND), whereby the ground potential generally employed in a ferroelectric memory can be employed as the reference potential $V_{ref2}$. Therefore, no circuit may be separately provided for generating the reference potential $V_{ref2}$ dissimilarly to a case of setting the reference potential $V_{ref2}$ to a level other than the ground level, whereby the circuit structure of the cross-point ferroelectric memory can be simplified.

The remaining effects of the sixth embodiment are similar to those of the aforementioned fifth embodiment.

Although the present invention has been described and illustrated in detail, it is clearly understood that the same is by way of illustration and example only and is not to be taken by way of limitation, the spirit and scope of the present invention being limited only by the terms of the appended claims.

Figure 25:
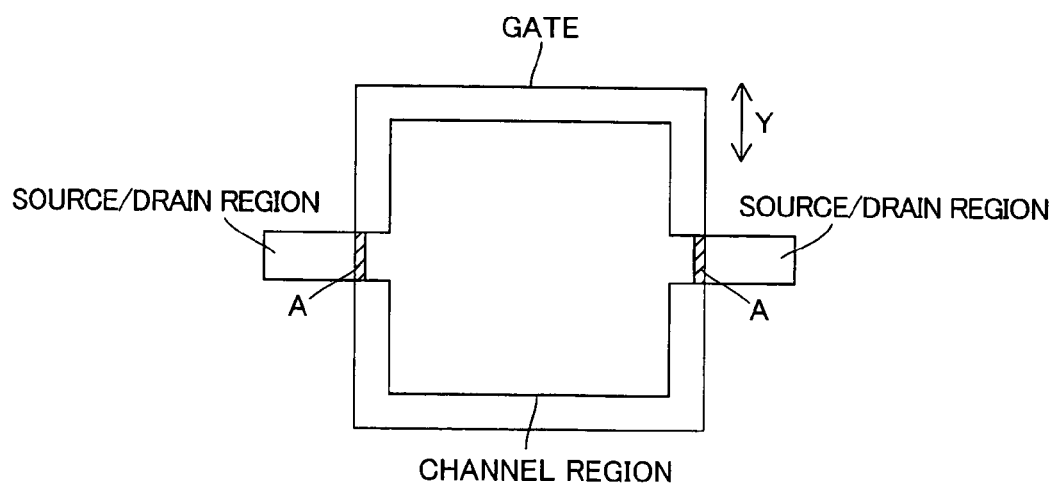
FIG. 25 is a plan view showing the structure of a transistor employed for booting an input potential and a reference potential according to a modification of the present invention.

For example, while each n- or p-channel transistor serving as a capacitor for booting the input potential $V_{in}$ and the reference potential $V_{ref}$ is so structured that the source/drain regions and the channel region have the same width along the gate width direction (direction Y in FIG. 25) in each of the aforementioned embodiments, the present invention is not restricted to this but each n- or p-channel transistor serving as a capacitor may alternatively have another structure. For example, each n- or p-channel transistor may alternatively be so structured that the width of the source/drain regions along the gate width direction (direction Y in FIG. 25) is smaller than that of the channel region along the gate width direction (direction Y in FIG. 25), as shown in FIG. 25. According to this structure, the areas of regions $\underline{A}$ where the gate and the source/drain regions overlap with each other can be so reduced as to reduce capacitances resulting from the regions regions $\underline{A}$ where the gate and the source/drain regions overlap with each other. If each n- or p-channel transistor serving as a capacitor for booting the input potential $V_{in}$ and the reference potential $V_{ref}$ is so structured that the width of the source/drain regions is smaller than that of the channel region, therefore, the difference between the input potential ($V_{in\alpha}$) and the reference potential ($V_{ref\alpha}$) enlarged by turning off the transistor can be further increased.

Figure 26:
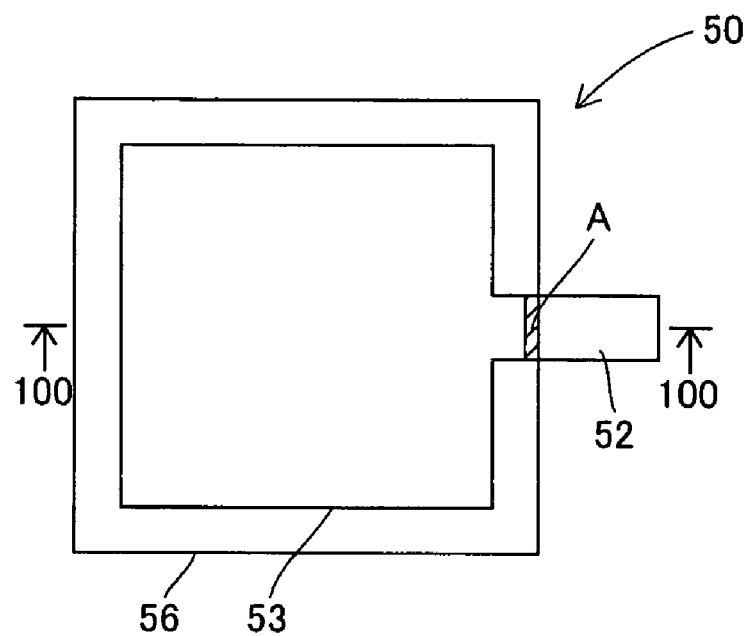
FIG. 26 is a plan view showing the structure of a capacitor employed for booting an input potential and a reference potential according to another modification of the present invention.
Figure 27:
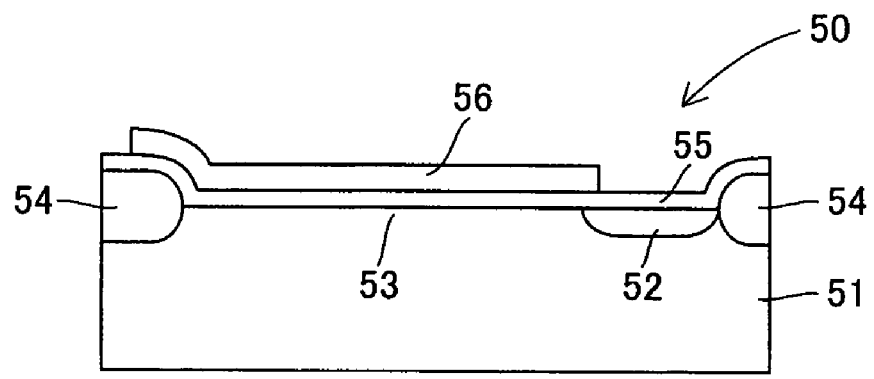
FIG. 27 is a sectional view of the capacitor according to the modification of the present invention taken along the line 100-100 in FIG. 26.

While an n-channel or p-channel transistor serving as a capacitor is employed as an example of the first or second capacitance means employed for booting the input potential $V_{in}$ and the reference potential $V_{ref}$ in each of the aforementioned embodiments, the present invention is not restricted to this but capacitance means other than the transistor is alternatively employable. For example, a capacitor 50 having a structure shown in FIGS. 26 and 27 can be employed as capacitance means for booting the input potential $V_{in}$ and the reference potential $V_{ref}$ and enlarging the difference therebetween. This capacitor 50 is an example of the "first capacitance means" or the "second capacitance means" in the present invention. The structure of the capacitor 50 is obtained by removing either the source region or the drain region from the transistor shown in FIG. 25. More specifically, an impurity diffusion region 52 is formed in the capacitor 50 by introducing an impurity into a prescribed region of a semiconductor substrate 51, as shown in FIG. 27. This impurity diffusion region 52 serves as a first electrode of the capacitor 50. On the semiconductor substrate 51, an inversion layer forming region 53 is formed adjacently to the impurity diffusion region 52 for forming an inversion layer and entering an ON-state from an OFF-state when a prescribed voltage is applied to an electrode layer 56 described later. An element isolation region 54 encloses this inversion layer forming region 53. The aforementioned impurity diffusion region 52 has a width smaller than that of the inversion layer forming region 53, as shown in FIG. 26. Further, an insulating film 55 is formed to cover the impurity diffusion region 52, the inversion layer forming region 53 and the element isolation region 54 of the semiconductor substrate 51, as shown in FIG. 27. The electrode layer 56 is formed on a region of the insulating film 55 corresponding to the inversion layer forming region 53 and partial regions of the impurity diffusion region 52 and the element isolation region 54 for serving as a second electrode of the capacitor 50. In this capacitor 50, the electrode layer 56 and the partial region of the impurity diffusion region 52 overlap with each other on a region regions $\underline{A}$. In the capacitor 50, the area of the region regions $\underline{A}$ where the electrode layer 56 and the partial region of the impurity diffusion region 52 overlap with each other can be further reduced as compared with the transistor shown in FIG. 25. When the capacitor 50 shown in FIG. 26 is employed for booting the input potential $V_{in}$ and the reference potential $V_{ref}$, therefore, the difference between the input potential ($V_{in\alpha}$) and the reference potential ($V_{ref\alpha}$) enlarged by bringing the capacitor 50 from an ON-state into an OFF-state can be further increased.

While the gate of each n- or p-channel transistor serving as a capacitor for booting the input potential $V_{in}$ and the reference potential $V_{ref}$ and enlarging the difference therebetween is connected to the node receiving the input potential $V_{in}$ or the reference potential $V_{ref}$ while the source/drain regions thereof are supplied with the boot signal in each of the aforementioned embodiments, the present invention is not restricted to this but the source/drain regions of the aforementioned n- or p-channel transistor may alternatively be connected to the node receiving the input potential $V_{in}$ or the reference potential $V_{ref}$ while supplying the boot signal to the gate. In this case, a boot signal falling from a prescribed potential to the ground potential is supplied to the gate of the aforementioned n-channel transistor. Thus, the aforementioned n-channel transistor enters an OFF-state in an intermediate stage of reduction of the boot signal input in the gate thereof to the ground potential. On the other hand, a boot signal rising from a prescribed potential to the potential Vcc is supplied to the gate of the aforementioned p-channel transistor. Thus, the aforementioned p-channel transistor enters an OFF-state in an intermediate stage of increase of the boot signal input in the gate thereof to the potential Vcc.

While each of the aforementioned embodiments employs the differential sense amplifier, the present invention is not restricted to this but a current-mirror sense amplifier is alternatively employable. Further, another type of operational amplifier is also employable.

While the potential comparison circuit according to the present invention is applied to the DRAM, the 1T1C ferroelectric memory or the cross-point ferroelectric memory in each of the aforementioned fourth to sixth embodiments, the present invention is not restricted to this but the inventive potential comparison circuit may alternatively be applied to a semiconductor device other than the above.

While the potential comparison circuit according to the aforementioned first embodiment brings the gates of the n-channel transistors Tr1 and Tr2 serving as capacitors into floating states respectively by turning off the n-channel transistors Tr3 and Tr4 before increasing the potentials of the gates of the n-channel transistors Tr1 and Tr2 respectively, the present invention is not restricted to this but the potential comparison circuit may not turn off the n-channel transistors Tr3 and Tr4 before increasing the potentials of the gates of the n-channel transistors Tr1 and Tr2 respectively if load capacitances present on input sides of the input potential $V_{in}$ and the reference potential $V_{ref}$ are small.

While each of the aforementioned embodiments boots the gate potential of each transistor by increasing or reducing the potentials of both source/drain regions of the transistor through the boot signal, the present invention is not restricted to this but the boot signal may alternatively be input in only either the source region or the drain region of the transistor for increasing or reducing the potential of only either the source region or the drain region receiving the boot signal thereby booting the gate potential of the transistor.

While the ferroelectric capacitor according to the aforementioned sixth embodiment applies the negative voltage $-\frac{1}{3}Vcc$ to the ferroelectric capacitors in data reading, the present invention is not restricted to this but the ferroelectric memory may alternatively apply a negative voltage other than the voltage $-\frac{1}{3}Vcc$ to the ferroelectric capacitors.

While each of the aforementioned embodiments is so formed as to change both of the transistor(s) serving as the capacitor(s) receiving the input potential(s) in the gate(s) thereof and the transistor(s) serving as the capacitor(s) receiving the reference potential in the gate(s) thereof from the ON-state(s) to the OFF-state(s) when enlarging the difference between the input potential(s) and the reference potential, the present invention is not restricted to this but may alternatively be so formed as to change only either the transistor(s) serving as the capacitor(s) receiving the input potential(s) in the gate (s) thereof or the transistor(s) serving as the capacitor(s) receiving the reference potential in the gate(s) thereof from the ON-state(s) to the OFF-state(s). Also in this case, the capacitance(s) between the gate(s) and the source/drain regions is so reduced in the transistor(s) changed to the OFF-state(s) that the rate(s) of change of the increased or reduced gate potential(s) of the transistor(s) is reduced, whereby the difference between the gate potential(s) of the transistor(s) and the gate potential(s) of the other transistor(s) held in the ON-state(s) can be enlarged. Thus, the difference between the input potential(s) and the reference potential can be enlarged.

What is claimed is:

1. A semiconductor device comprising
first capacitance means and second capacitance means having different ON- and OFF-state capacitances, for bringing said first capacitance means or said second capacitance means from an ON- state into an OFF- state in a process of changing the potential of a first electrode of said first capacitance means and the potential of a first electrode of said second capacitance means from a first potential to a second potential thereby enlarging the difference between a potential input in a second electrode of said first capacitance means and a potential input in a second electrode of said second capacitance means and comparing said potential input in said second electrode of said first capacitance means and said potential input in said second electrode of said second capacitance means with each other.

2. The semiconductor device according to claim 1, wherein said first capacitance means and said second capacitance means having said different ON- and OFF- state capacitances include either transistor elements serving as capacitors or capacitive elements, switchable between ON- and OFF- states, other than said transistor elements.

3. The semiconductor device according to claim 1, wherein said first capacitance means and said second capacitance means have substantially identical threshold voltages bringing ON- states when said first electrode of said first capacitance means and said first electrode of said second capacitance means are at said first potential while bringing OFF- states when said first electrode of said first capacitance means and said first electrode of second capacitance means are at said second potential,
the potential of said first electrode of said first capacitance means and the potential of said first electrode of said second capacitance means are changed from said first potential to said second potential at a first rate of change thereby the potential of said second electrode of said first capacitance means and the potential of said second electrode of said second capacitance means are changed at a second rate of change smaller than said first rate of change.

4. The semiconductor device according to claim 3, reducing said second rate of change for the potential of said second electrode of said first capacitance means by changing the potential of said first electrode of said first capacitance means and the potential of said first electrode of said second capacitance means at said first electrode of said second capacitance means at said first rate of change while reducing the absolute value of the difference between the potential of said second electrode of said first capacitance means and the potential of said first electrode of said first capacitance means below the absolute value of said threshold voltage of said first capacitance means thereby bringing said first capacitance means from an ON- state into an OFF- state, and thereafter reducing said second rate of change for the potential of said second electrode of said second capacitance means by reducing the absolute value of the difference between the potential of said second electrode of said second capacitance means and the potential of said first electrode of said second capacitance means below the absolute value of said threshold voltage of said second capacitance means thereby bringing said second capacitance means from an ON- state into an OFF- state with a delay of a prescribed period.

5. The semiconductor device according to claim 1, reducing said second rate of change for the potential of said second electrode of either said first capacitance means or said second capacitance means by changing the potential of said first electrode of said first capacitance means and the potential of said first electrode of said second capacitance means from said first potential to said second potential at said first rate of change while reducing the absolute value of the difference between the potentials of said first and second electrodes of either said first capacitance means or said second capacitance means below the absolute value of said threshold voltage of corresponding said first or second capacitance means thereby bringing either said first capacitance means or said second capacitance means into an OFF- state.

6. The semiconductor device according to claim 1, further comprising a boot circuit outputting a potential changing from said first potential to said second potential at a first rate of change to said first electrode of said first capacitance means and said first electrode of said second capacitance means.

7. The semiconductor device according to claim 6, wherein said boot circuit includes a first transistor having a threshold voltage substantially identical to that of either said first capacitance means or said second capacitance means, voltage change means reducing or increasing the potential of the source region or the drain region of said first transistor by a prescribed voltage and a second transistor for changing the potential of the source region or the drain region of said first transistor to said second potential at said first rate of change, for inputting a potential substantially identical to said potential input in said second electrode of either said first capacitance means or said second capacitance means in the gate electrode of said first transistor when the potential of said first electrode of either said first capacitance means or said second capacitance means is at said first potential.

8. The semiconductor device according to claim 7, wherein said voltage change means includes either a high resistance or a transistor.

9. The semiconductor device according to claim 1, comprising a plurality of potential difference enlarging circuits including said first capacitance means and said second capacitance means, for enlarging the difference between said potential input in said second electrode of said first capacitance means and said potential input in said second electrode of said second capacitance means a plurality of times through said plurality of potential difference enlarging circuits.

10. The semiconductor device according to claim 9, wherein said plurality of potential difference enlarging circuits include:

a first potential difference enlarging circuit including first conductivity type said first capacitance means and first conductivity type said second capacitance means, and a second potential difference enlarging circuit including second conductivity type said first capacitance means and second conductivity type said second capacitance means, wherein said semiconductor device inputs said first potential in said second electrode of said first conductivity type first capacitance means and said second electrode of said second conductivity type first capacitance means while inputting said second potential in said second electrode of said first conductivity type second capacitance means and said second electrode of said second conductivity type second capacitance means, and enlarges the difference between said first potential input in said second electrode of said first conductivity type first capacitance means and said second potential input in said second electrode of said first conductivity type second capacitance means through said first potential difference enlarging circuit and thereafter enlarging the difference between said first potential in said second electrode of said second conductivity type first capacitance means and said second potential in said second electrode of said second conductivity type second capacitance means.

11. The semiconductor device according to claim 1, wherein said first capacitance means includes a third transistor serving as a capacitor having different ON- and OFF- state capacitances, said first electrode of said first capacitance means includes at least either the source region or the drain region of said third transistor, said second electrode of said first capacitance means includes the gate electrode of said third transistor, said second capacitance means includes a fourth transistor serving as a capacitor having different ON- and OFF- state capacitances, said first electrode of said first capacitance means includes the gate electrode of said third translator, said second electrode of said third transistor, said second electrode of said first capacitance means includes at least either the source region or the drain region of said transistor, said second capacitance means includes a fourth transistor serving as a capacitor having different ON- and OFF- state capacitances, said first electrode of said second capacitance means includes the gate electrode of said fourth transistor, and said second electrode of said second capacitance means includes at least either the source region or the drain region of said fourth transistor.

12. The semiconductor device according to claim 1, wherein said first capacitance means includes a third transistor serving as a capacitor having different ON- and OFF- state capacitances, said first electrode of said first capacitance means includes the gate electrode of said third transistor, said second electrode of said first capacitance means includes at least either the source region or the drain region of said third transistor, said second capacitance means includes a fourth transistor serving as a capacitor having different ON- and OFF- state capacitances, said first electrode of said second capacitance means includes the gate electrode of said fourth transistor, and said second electrode of said second capacitance means includes at least either the source region or the drain region of said fourth transistor.

13. The semiconductor device according to claim 1, wherein said first capacitance means includes a third transistor serving as a capacitor having different ON- and OFF- state capacitances, said second capacitance means includes a fourth transistor serving as a capacitor having different ON- and OFF- state capacitances, and said ON- state capacitances of said third transistor and said fourth transistor are larger than said OFF- state capacitances.

14. The semiconductor device according to claim 13, wherein said third transistor and said fourth transistor have gate widths smaller than gate lengths.

15. The semiconductor device according to claim 1, further comprising:

storage means holding data, and a data line linked with said storage means and connected to said second electrode of either said first capacitance means or said second capacitance means, for inputting a potential responsive to said data held in said storage means in said second electrode of either said first capacitance means or said second capacitance means through said data line while inputting a reference potential in said second electrode of either said second capacitance means or said first capacitance means when reading said data.

16. The semiconductor device according to claim 15, wherein
said storage means includes either a ferroelectric capacitor or a capacitor.

17. The semiconductor device according to claim 15, further comprising a driving line linked with said storage means,
for applying a voltage pulse to said storage means through said driving line when reading said data thereby inputting a negative potential in said second electrode of either said first capacitance means or said second capacitance means from said storage means through said data line if said storage means holds first data while inputting a positive potential in said second electrode of either said first capacitance means or said second capacitance means from said storage means through said data line if said storage means holds second data.

18. The semiconductor device according to claim 17, wherein
said storage means includes a ferroelectric capacitor having a ferroelectric film provided between a word line and a bit line arranged to intersect with each other.

19. A semiconductor device comprising:
first capacitance means and second capacitance means having different ON- and OFF- state capacitances, for changing the potential of a first electrode of said first capacitance means and the potential of a first electrode of said second capacitance means from a first potential to a second potential thereby enlarging the difference between a potential input in a second electrode of said first capacitance means and a potential input in a second electrode of said second capacitance means and comparing said potential input in said second electrode of said first capacitance means and said potential input in said second electrode of said second capacitance means with each other; and
a determination circuit determining whether the potential of said second electrode of either said first capacitance means or said second capacitance means is higher or lower than the potential of said second electrode of either said second capacitance means or said first capacitance means by comparing the potential of said second electrode of said first capacitance means and the potential of said second electrode of said second capacitance means after said enlargement of said potential difference with each other.

20. The semiconductor device according to claim 19, wherein
said determination circuit includes a sense amplifier determining whether the potential of said second electrode of either said first capacitance means or said second capacitance means is higher or lower than the potential of said second electrode of either said second capacitance means or said first capacitance means by further amplifying the difference between the potential of said second electrode of said first capacitance means and the potential of said second electrode of said first capacitance means and the potential of said second electrode of said second capacitance means after said enlargement of said potential difference and thereafter comparing the potential of said second electrode of said first capacitance means and the potential of said second electrode of said second capacitance means with each other.

\* \* \* \* \*